(12) United States Patent  (10) Patent No.: US 8,575,661 B2
Iwabuchi  (45) Date of Patent: Nov. 5, 2013

(54) SOLID-STATE IMAGE PICK-UP DEVICE AND MANUFACTURING METHOD THEREOF, IMAGE-PICKUP APPARATUS, SEMICONDUCTOR DEVICE AND MANUFACTURING METHOD THEREOF, AND SEMICONDUCTOR SUBSTRATE

(75) Inventor: Shin Iwabuchi, Kumamoto (JP)

(73) Assignee: Sony Corporation (JP)

( * ) Notice: Subject to any disclaimer, the term of this patent is extended or adjusted under 35 U.S.C. 154(b) by 953 days.

(21) Appl. No.: 12/695,355

(22) Filed: Jan. 28, 2010

(65) Prior Publication Data

US 2010/0201854 A1  Aug. 12, 2010

(30) Foreign Application Priority Data

Feb. 6, 2009  (JP) ................. 2009-026368

(51) Int. Cl.
*H01L 27/148* (2006.01)
(52) U.S. Cl.
USPC .......... 257/226; 257/432; 257/461; 257/632; 257/E31.12; 257/E29.109; 257/E21.318; 438/58; 438/69
(58) Field of Classification Search
USPC ............... 257/226, 432, 461, 632, E31.12, 257/E29.109, E21.318; 438/58, 69
See application file for complete search history.

(56) References Cited

U.S. PATENT DOCUMENTS

| 2005/0151218 A1* | 7/2005 | Mouli ........................ 257/446 |
| 2006/0033827 A1 | 2/2006 | Kanbe et al. |
| 2007/0210395 A1 | 9/2007 | Maruyama et al. |
| 2008/0283726 A1 | 11/2008 | Uya et al. |
| 2010/0301340 A1* | 12/2010 | Shih et al. ........................ 257/59 |

FOREIGN PATENT DOCUMENTS

| JP | 06-061235 | 3/1994 |
| JP | 2003-031785 | 1/2003 |
| JP | 2007-088450 | 4/2007 |

OTHER PUBLICATIONS

European Search Report dated May 9, 2012, in connection with counterpart EP Application No. 10 15 2062.

* cited by examiner

*Primary Examiner* — Tu-Tu Ho
(74) *Attorney, Agent, or Firm* — Sheridan Ross P.C.

(57) ABSTRACT

A solid-state image pick-up device is provided which includes a semiconductor substrate main body which has an element forming layer and a gettering layer provided on an upper layer thereof; photoelectric conversion elements, each of which includes a first conductive type region, provided in the element forming layer; and a dielectric film which is provided on an upper layer of the gettering layer and which induces a second conductive type region in a surface of the gettering layer.

10 Claims, 18 Drawing Sheets

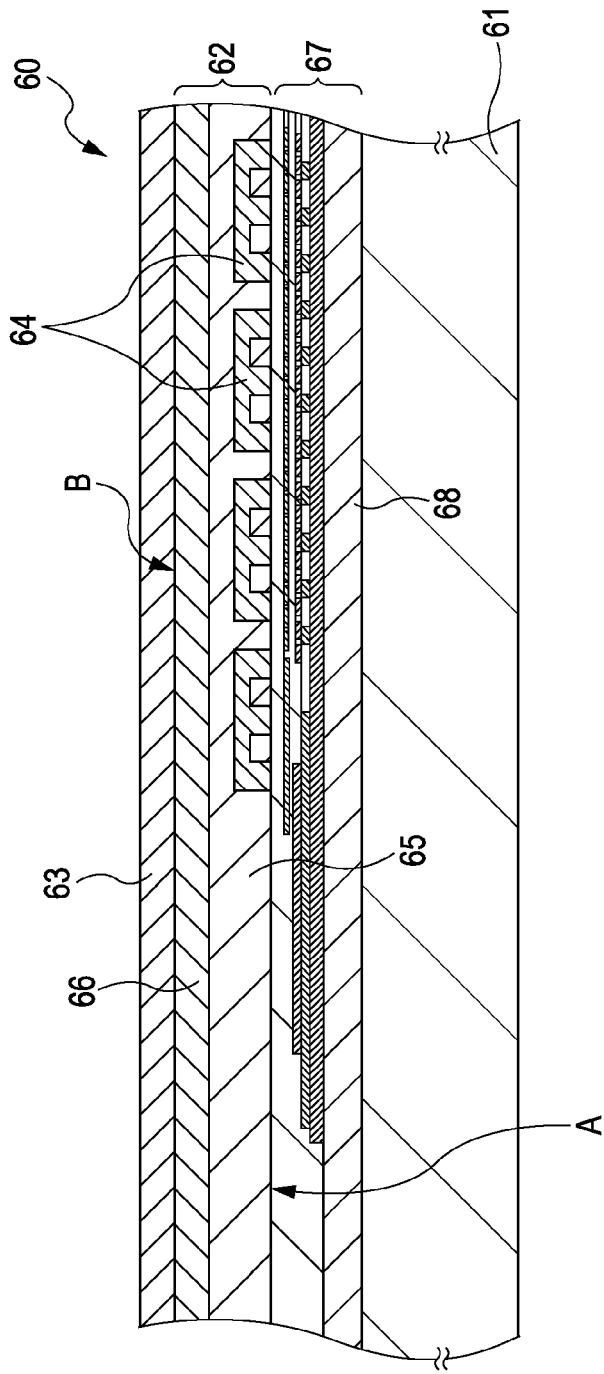

SOLID-STATE IMAGE PICK-UP DEVICE AND MANUFACTURING METHOD THEREOF, IMAGE-PICKUP APPARATUS, SEMICONDUCTOR DEVICE AND MANUFACTURING METHOD THEREOF, AND SEMICONDUCTOR SUBSTRATE

BACKGROUND OF THE INVENTION

1. Field of the Invention

The present invention relates to a solid-state image pick-up device and a manufacturing method thereof; an image pick-up apparatus; a semiconductor device and a manufacturing method thereof; and a semiconductor substrate. In more particular, the present invention relates to a solid-state image pick-up device in which a gettering layer is provided on an upper layer of an element forming layer to suppress metal contamination and a manufacturing method of the solid-state image pick-up device; an image pick-up apparatus; a semiconductor device and a manufacturing method thereof; and a semiconductor substrate.

2. Description of the Related Art

A thin semiconductor device having a high strength, such as a rear surface irradiation type solid-state image pick-up device, has an element forming layer and a wiring layer provided on one surface of the element forming layer. In the element forming layer, photoelectric conversion elements and active elements are formed, and the active elements convert signal charges which are photoelectric-converted by the photoelectric conversion elements into electrical signals and output the electrical signals. In addition, the wiring layer performs wiring of the active elements formed in the element forming layer. Furthermore, it is configured such that visible light is incident on the photoelectric conversion elements from one surface of the element forming layer located at a side opposite to that of the wiring layer (see for example, Japanese Unexamined Patent Application Publication No. 2003-31785).

In order to optimize the spectral balance of color to the photoelectric conversion element when visible light is converted into an electrical signal and also to form a pixel having a desired device structure from a front surface side to a rear surface side, the element forming layer is preferably formed to have a desired small thickness. For example, in the case of a solid-state image pick-up device in which a silicon substrate is used as the element forming layer, the thickness thereof is preferably decreased to 10 μm or less.

As a semiconductor substrate in which elements, such as photoelectric conversion elements and active elements, are formed in a three-dimensional manner, in general, a silicon substrate having an SOI structure is used in which an element forming layer (SOI layer) made of silicon is formed on a silicon substrate functioning as a support substrate with a $SiO_2$ film (BOX layer) interposed therebetween.

Next, with reference to FIGS. 15 and 16, a related example will be described in which a rear surface irradiation type solid-state image pick-up device is formed using a semiconductor substrate which has an SOI structure.

As shown in FIG. 15, a silicon oxide film ($SiO_2$) 102 having a thickness of approximately 1 μm is formed on a surface of a silicon substrate 101 functioning as a support substrate, and an element forming layer 103 having an SOI structure is formed on the silicon oxide film 102. In addition, in the element forming layer 103, there are formed photoelectric conversion elements 104 and active elements (not shown) which convert signal charges photoelectric-converted by the photoelectric conversion elements into electrical signals and which output the above signals. Furthermore, a wiring layer 105 which performs wiring of the active elements is formed on the surface of the element forming layer 103.

In the semiconductor substrate of the solid-state image pick-up device described above, after the elements are formed in the element forming layer 103, and the wiring layer 105 is formed, as shown in FIG. 16, the thickness of the semiconductor substrate is decreased from a rear surface side (visible light incident side), so that only the element forming layer 103 is allowed to remain.

In the semiconductor structure having an SOI structure described above, the silicon oxide film 102 is formed in the semiconductor substrate. Hence, when the thickness of the semiconductor substrate is decreased by wet etching, the etching can be stopped by the silicon oxide film 102. In addition, when the silicon oxide film 102 is subsequently peeled away, only the element forming layer 103 may be allowed to remain.

However, a method for manufacturing a semiconductor substrate including a different type of material ($SiO_2$), such as a semiconductor substrate having an SOI structure, is complicated, and the product obtained by the method described above is expensive. In addition, since a gettering layer is not formed in the element forming layer 103, after the silicon oxide film 102 is removed, it is difficult to prevent metal contamination caused by heavy metals in various processes.

In addition, heretofore, a technique has been proposed in which a structure having a gettering effect against metal contamination is formed in a semiconductor substrate at a rear surface side (for example, see Japanese Unexamined Patent Application Publication No. 6-61235).

However, in the case in which an insulating film is present in a substrate as in a semiconductor substrate having an SOI structure, since the insulating film prevents the diffusion of metals, even when the gettering effect is imparted to a rear surface side of the semiconductor substrate having an SOI structure, the gettering effect described above may not be sufficiently obtained. In addition, in the case in which the thickness of the semiconductor substrate is decreased from a rear surface side thereof so that only an SOI layer is allowed to remain, the gettering layer formed in the semiconductor substrate at a rear surface side is also removed, and hence in a process after the gettering layer is removed, no gettering effect can be obtained.

In addition, another technique is also conceived in which a gettering layer is formed in a deep region of an SOI layer which is close to a BOX layer. However, when the gettering layer is provided in a deep region of the SOI layer, in the case in which elements are formed not only in a surface region of the SOI layer but also in a region thereof in a depth direction, degradation in element characteristics caused by crystalline defects derived from the gettering layer may occur in some cases.

Accordingly, in order to prevent metal contamination and to suppress the degradation in element characteristics, a technique has been proposed in which a gettering layer is provided between an element forming layer in which elements are formed and a thin film-forming removal layer laminated on one surface of the element forming layer (see for example, Japanese Unexamined Patent Application Publication No. 2007-88450).

SUMMARY OF THE INVENTION

However, electrons and the like generated due to the presence of the gettering layer may cause noises in some cases. That is, in general, the gettering layer is a defective layer formed in a silicon single crystal, and even when a silicon substrate is metal-contaminated, the defective layer collects metals using heat generated in a wafer process. Hence, the influence of contamination can be suppressed in a silicon substrate in which elements are formed. However, since the gettering layer is formed from a defective layer, electrons and the like generated therefrom as described above may adversely cause noises in some cases. Hence, as described above, it is believed that electrons and the like generated due to the presence of the gettering layer may cause noises.

The present invention has been conceived in consideration of the problems described above, and it is desirable to provide a solid-state image pick-up device which can suppress noises generated due to the presence of a gettering layer and a manufacturing method of the solid-state image pick-up device; an image pick-up apparatus; a semiconductor device and a manufacturing method thereof; and a semiconductor substrate.

According to an embodiment of the present invention, there is provided a solid-state image pick-up device which includes a semiconductor substrate main body which includes an element forming layer and a gettering layer provided on an upper layer thereof; photoelectric conversion elements, each of which includes a first conductive type region, provided in the element forming layer; and a dielectric film which is provided on an upper layer of the gettering layer and which induces a second conductive type region in a surface of the gettering layer.

According to an embodiment of the present invention, there is provided an image pick-up apparatus which includes a solid-state image pick-up device including a semiconductor substrate main body which has an element forming layer and a gettering layer provided on an upper layer thereof; photoelectric conversion elements, each of which includes a first conductive type region, formed in the element forming layer; and a dielectric film which is provided on an upper layer of the gettering layer and which induces a second conductive type region in a surface of the gettering layer; an optical system for guiding incident light from an object to the solid-state image pick-up device; and a signal processing circuit for processing an output signal from the solid-state image pick-up device.

In addition, according to an embodiment of the present invention, there is provided a semiconductor device which includes: a semiconductor substrate main body which includes an element forming layer and a gettering layer provided on an upper layer of the element forming layer; a device which includes a first conductive type region and is formed in the element forming layer; and a dielectric film which is provided on an upper layer of the gettering layer and which induces a second conductive type region in a surface of the gettering layer.

In addition, according to an embodiment of the present invention, there is provided a semiconductor substrate which includes: a semiconductor substrate main body which includes an element forming layer in which a device including a first conductive type region is provided and a gettering layer provided on an upper layer of the element forming layer; and a dielectric film which is provided on an upper layer of the gettering layer and which induced a second conductive type region in a surface of the gettering layer.

Since the second conductive type region is induced in the surface of the gettering layer by the dielectric film, even if electrons are generated due to crystalline defects of the gettering layer, electrons and holes are combined with each other in the surface of the gettering layer, and hence electrons are not likely to enter devices, such as photoelectric conversion elements, provided in the element forming layer.

In addition, according to an embodiment of the present invention, there is provided a solid-state image pick-up device which includes: an element forming layer in which photoelectric conversion elements each including a first conductive type region are provided; a second conductive type impurity region provided on an upper layer of the element forming layer; and a gettering layer provided on an upper layer of the impurity region.

In addition, according to an embodiment of the present invention, there is provided an image pick-up apparatus which includes: a solid-state image pick-up device including an element forming layer in which photoelectric conversion elements each including a first conductive type region are formed, a second conductive type impurity region provided on an upper layer of the element forming layer, and a gettering layer provided on an upper layer of the impurity region; an optical system for guiding incident light from an object to the solid-state image pick-up device; and a signal processing circuit for processing an output signal from the solid-state image pick-up device.

In addition, according to an embodiment of the present invention, there is provided a semiconductor device which includes: an element forming layer in which a device including a first conductive type region is formed; a second conductive type impurity region provided on an upper layer of the element forming layer; and a gettering layer provided on an upper layer of the impurity region.

In addition, according to an embodiment of the present invention, there is provided a semiconductor substrate which includes: an element forming layer in which a device including a first conductive type region is provided; a second conductive type impurity region provided on an upper layer of the element forming layer; and a gettering layer provided on an upper layer of the impurity region.

By the second conductive type impurity region provided on the upper layer of the element forming layer, even if electrons are generated due to crystalline defects of the gettering layer, electrons and holes are combined with each other in the impurity region, and as a result, electrons are not likely to enter devices, such as photoelectric conversion elements, provided in the element forming layer.

In addition, according to an embodiment of the present invention, there is provided a method for manufacturing a solid-state image pick-up device, which includes the steps of: forming photoelectric conversion elements, each of which includes a first conductive type region, in an element forming layer of a semiconductor substrate main body; forming a gettering layer on an upper layer of the element forming layer; and forming a dielectric film on an upper layer of the gettering layer to induce a second conductive type region in a surface thereof.

In addition, according to an embodiment of the present invention, there is provided a method for manufacturing a solid-state image pick-up device, which includes the steps of: forming photoelectric conversion elements, each of which includes a first conductive type region, in an element forming layer of a semiconductor substrate main body which includes the element forming layer and a gettering layer formed on an upper layer thereof; and forming a dielectric film on an upper layer of the gettering layer to induce a second conductive type region in a surface thereof.

In addition, according to an embodiment of the present invention, there is provided a method for manufacturing a solid-state image pick-up device, which includes the steps of: forming photoelectric conversion elements, each of which includes a first conductive type region, in an element forming layer of a semiconductor substrate main body; forming a gettering layer between the element forming layer and a thin film-forming removal layer of the semiconductor substrate main body; removing the thin film-forming removal layer by etching using the gettering layer as an etching stopper; and forming a dielectric film on an upper layer of the gettering layer to induce a second conductive type region in a surface thereof.

In addition, according to an embodiment of the present invention, there is provided a method for manufacturing a solid-state image pick-up device, which includes the steps of: forming photoelectric conversion elements, each of which includes a first conductive type region, in an element forming layer of a semiconductor substrate main body which includes the element forming layer, a gettering layer formed on an upper layer thereof, and a thin film-forming removal layer formed on an upper layer of the gettering layer; removing the thin film-forming removal layer by etching using the gettering layer as an etching stopper; and forming a dielectric film on the upper layer of the gettering layer to induce a second conductive type region in a surface thereof.

In addition, according to an embodiment of the present invention, there is provided a method for manufacturing a semiconductor device, which includes the steps of: forming a device including a first conductive type region in an element forming layer of a semiconductor substrate main body; forming a gettering layer on an upper layer of the element forming layer; and forming a dielectric film on an upper layer of the gettering layer to induce a second conductive type region in a surface thereof.

In addition, according to an embodiment of the present invention, there is provided a method for manufacturing a semiconductor device, which includes the steps of: forming a device including a first conductive type region in an element forming layer of a semiconductor substrate main body which includes the element forming layer and a gettering layer formed on an upper layer thereof; and forming a dielectric film on an upper layer of the gettering layer to induce a second conductive type region in a surface thereof.

In addition, according to an embodiment of the present invention, there is provided a method for manufacturing a semiconductor device, which includes the steps of: forming a device including a first conductive type region in an element forming layer of a semiconductor substrate main body; forming a gettering layer between the element forming layer and a thin film-forming removal layer of the semiconductor substrate main body; removing the thin film-forming removal layer by etching using the gettering layer as an etching stopper; and forming a dielectric film on an upper layer of the gettering layer to induce a second conductive type region in a surface thereof.

In addition, according to an embodiment of the present invention, there is provided a method for manufacturing a semiconductor device, which includes the steps of: forming a device including a first conductive type region in an element forming layer of a semiconductor substrate main body which includes the element forming layer, a gettering layer formed on an upper layer thereof, and a thin film-forming removal layer formed on an upper layer of the gettering layer; removing the thin film-forming removal layer by etching using the gettering layer as an etching stopper; and forming a dielectric film on an upper layer of the gettering layer to induce a second conductive type region in a surface thereof.

Since the dielectric film which induces the second conductive type region in the surface of the gettering layer is formed on the surface of the gettering layer, even if electrons are generated due to crystalline defects of the gettering layer, electrons and holes are combined with each other in the surface of the gettering layer, and hence electrons are not likely to enter devices, such as photoelectric conversion elements, provided in the element forming layer.

In addition, according to an embodiment of the present invention, there is provided a method for manufacturing a solid-state image pick-up device, which includes the steps of: forming photoelectric conversion elements, each of which includes a first conductive type region, in an element forming layer of a semiconductor substrate main body; and forming a second conductive type impurity region on an upper layer of the element forming layer and forming a gettering layer on an upper layer of the impurity region, or forming a gettering layer on an upper layer of the element forming layer and forming a second conductive type impurity region between the element forming layer and the gettering layer.

In addition, according to an embodiment of the present invention, there is provided a method for manufacturing a solid-state image pick-up device, which includes the steps of: forming photoelectric conversion elements, each of which includes a first conductive type region, in an element forming layer of a semiconductor substrate main body which includes the element forming layer and a gettering layer formed on an upper layer thereof and forming a second conductive type impurity region between the element forming layer and the gettering layer, or forming a second conductive type impurity region between an element forming layer and a gettering layer of a semiconductor substrate main body which includes the element forming layer and the gettering layer formed on an upper layer thereof and forming photoelectric conversion elements, each of which includes a first conductive type region, in the element forming layer.

In addition, according to an embodiment of the present invention, there is provided a method for manufacturing a solid-state image pick-up device, which includes the steps of: forming photoelectric conversion elements, each of which includes a first conductive type region, in an element forming layer of a semiconductor substrate main body; forming a second conductive type impurity region between the element forming layer and a thin film-forming removal layer of the semiconductor substrate main body and forming a gettering layer between the impurity region and the thin film-forming removal layer, or forming a gettering layer between the element forming layer and a thin film-forming removal layer of the semiconductor substrate main body and forming a second conductive type impurity region between the element forming layer and the gettering layer; and removing the thin film-forming removal layer by etching using the gettering layer as an etching stopper.

In addition, according to an embodiment of the present invention, there is provided a method for manufacturing a solid-state image pick-up device, which includes the steps of: forming photoelectric conversion elements, each of which includes a first conductive type region, in an element forming layer of a semiconductor substrate main body which includes the element forming layer, a gettering layer formed on an upper layer thereof, and a thin film-forming removal layer formed on an upper layer of the gettering layer and forming a second conductive type impurity region between the element forming layer and the gettering layer, or forming a second conductive type impurity region between an element forming layer and a gettering layer of a semiconductor substrate main body which includes the element forming layer, the gettering layer formed on an upper layer thereof, and a thin film-forming removal layer formed on an upper layer of the gettering layer and forming photoelectric conversion elements, each of which includes a first conductive type region, in the element forming layer; and removing the thin film-forming removal layer by etching using the gettering layer as an etching stopper.

In addition, according to an embodiment of the present invention, there is provided a method for manufacturing a semiconductor device, which includes the steps of: forming a device including a first conductive type region in an element forming layer of a semiconductor substrate main body; and forming a second conductive type impurity region on an upper layer of the element forming layer and forming a gettering layer on an upper layer of the impurity region, or forming a gettering layer on an upper layer of the element forming layer and forming a second conductive type impurity region between the element forming layer and the gettering layer.

In addition, according to an embodiment of the present invention, there is provided a method for manufacturing a semiconductor device, which includes the steps of: forming a device including a first conductive type region in an element forming layer of a semiconductor substrate main body which includes the element forming layer and a gettering layer formed on an upper layer thereof and forming a second conductive type impurity region between the element forming layer and the gettering layer, or forming a second conductive type impurity region between an element forming layer and a gettering layer of a semiconductor substrate main body which includes the element forming layer and the gettering layer formed on an upper layer thereof and forming a device including a first conductive type region in the element forming layer.

In addition, according to an embodiment of the present invention, there is provided a method for manufacturing a semiconductor device, which includes the steps of: forming a device including a first conductive type region in an element forming layer of a semiconductor substrate main body; forming a second conductive type impurity region between the element forming layer and a thin film-forming removal layer of the semiconductor substrate main body and forming a gettering layer between the impurity region and the thin film-forming removal layer, or forming a gettering layer between the element forming layer and a thin film-forming removal layer of the semiconductor substrate main body and forming a second conductive type impurity region between the element forming layer and the gettering layer; and removing the thin film-forming removal layer by etching using the gettering layer as an etching stopper.

In addition, according to an embodiment of the present invention, there is provided a method for manufacturing a semiconductor device, which includes the steps of: forming a device including a first conductive type region in an element forming layer of a semiconductor substrate main body which includes the element forming layer, a gettering layer formed on an upper layer thereof, and a thin film-forming removal layer formed on an upper layer of the gettering layer and forming a second conductive type impurity region between the element forming layer and the gettering layer, or forming a second conductive type impurity region between an element forming layer and a gettering layer of a semiconductor substrate main body which includes the element forming layer, the gettering layer formed on an upper layer thereof, and a thin film-forming removal layer formed on an upper layer of the gettering layer and forming a device including a first conductive type region in the element forming layer; and removing the thin film-forming removal layer by etching using the gettering layer as an etching stopper.

Since the second conductive type impurity region is formed on the upper layer of the element forming layer, even if electrons are generated due to crystalline defects of the gettering layer, electrons and holes are combined with each other in the impurity region, and hence electrons are not likely to enter devices, such as photoelectric conversion elements, provided in the element forming layer.

In the solid-state image pick-up device and the manufacturing method thereof, the image pick-up apparatus, the semiconductor device and the manufacturing method thereof, and the semiconductor substrate, according to an embodiment of the present invention, noises generated by the presence of the gettering layer can be suppressed.

BRIEF DESCRIPTION OF THE DRAWINGS

FIG. 7 is a schematic cross-sectional view illustrating one example of a semiconductor device according to an embodiment of the present invention;

DESCRIPTION OF THE PREFERRED EMBODIMENTS

Hereinafter, the best mode (hereinafter referred to as "embodiment") for carrying out the present invention will be described. The description will be made in the following order.
1. First embodiment (case (1) of a solid-state image pick-up device)
2. Second embodiment (case (1) of a semiconductor device)
3. Third embodiment (case of an image pick-up apparatus)
4. Fourth embodiment (case (2) of a solid-state image pick-up device)
5. Fifth embodiment (case (2) of a semiconductor device)

1. First Embodiment

Structure of a Solid-State Image Pick-Up Device

Figure 1:
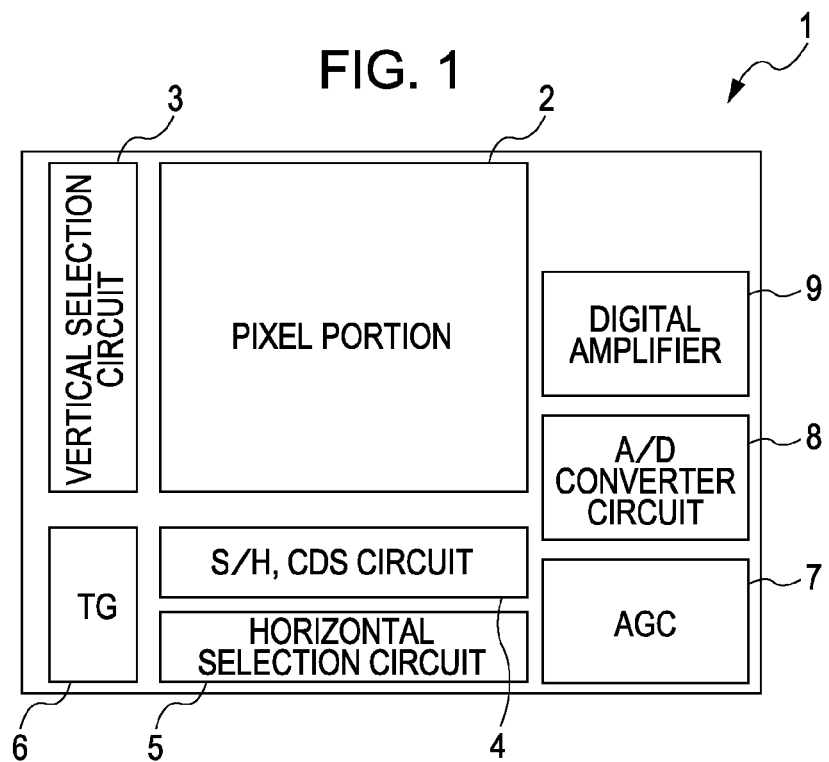
FIG. 1 is a schematic structural view illustrating a rear surface irradiation type solid-state image pick-up device which is one example of a solid-state image pick-up device according to an embodiment of the present invention.

FIG. 1 is a schematic structural view illustrating a rear surface irradiation type solid-state image pick-up device which is one example of a solid-state image pick-up device according to an embodiment of the present invention. A solid-state image pick-up device 1 of this embodiment has a pixel portion 2 and a peripheral circuit portion, and these portions are mounted on the same semiconductor substrate. In the first embodiment, the peripheral circuit portion includes a vertical selection circuit 3, a sample hold correlation double sampling (S/H·CDS) circuit 4, a horizontal selection circuit 5, a timing generator (TG) 6, an automatic gain control (AGC) circuit 7, an A/D converter circuit 8, and a digital amplifier 9.

In the pixel portion 2, many unit pixels which will be described later are disposed in a matrix form, address lines and the like are provided on a row basis, and signal lines and the like are provided on a column basis.

The vertical selection circuit 3 sequentially selects pixels on a row basis, and signals of individual pixels are read into the S/H·CDS circuit 4 for individual pixel columns through the vertical signal lines. The S/H·CDS circuit 4 performs a signal processing, such as correlated double sampling (CDS), on the pixel signals read from the individual pixel columns.

The horizontal selection circuit 5 sequentially takes out the pixel signals held in the S/H·CDS circuit 4 and output the pixel signals to the AGC circuit 7. The AGC circuit 7 amplifies the signals input from the horizontal selection circuit 5 with an appropriate gain and outputs the amplified signals to the A/D converter circuit 8.

The A/D converter circuit 8 converts the analog signals input from the AGC circuit 7 into digital signals and outputs the digital signals to the digital amplifier 9. The digital amplifier 9 appropriately amplifies the digital signals input from the A/D converter circuit 8 and outputs the amplified digital signals to pads (terminals).

The operations of the vertical selection circuit 3, the S/H·CDS circuit 4, the horizontal selection circuit 5, the AGC circuit 7, the A/D converter circuit 8, and the digital amplifier 9 are performed based on various types of timing signals output from the timing generator 6.

Figure 2:
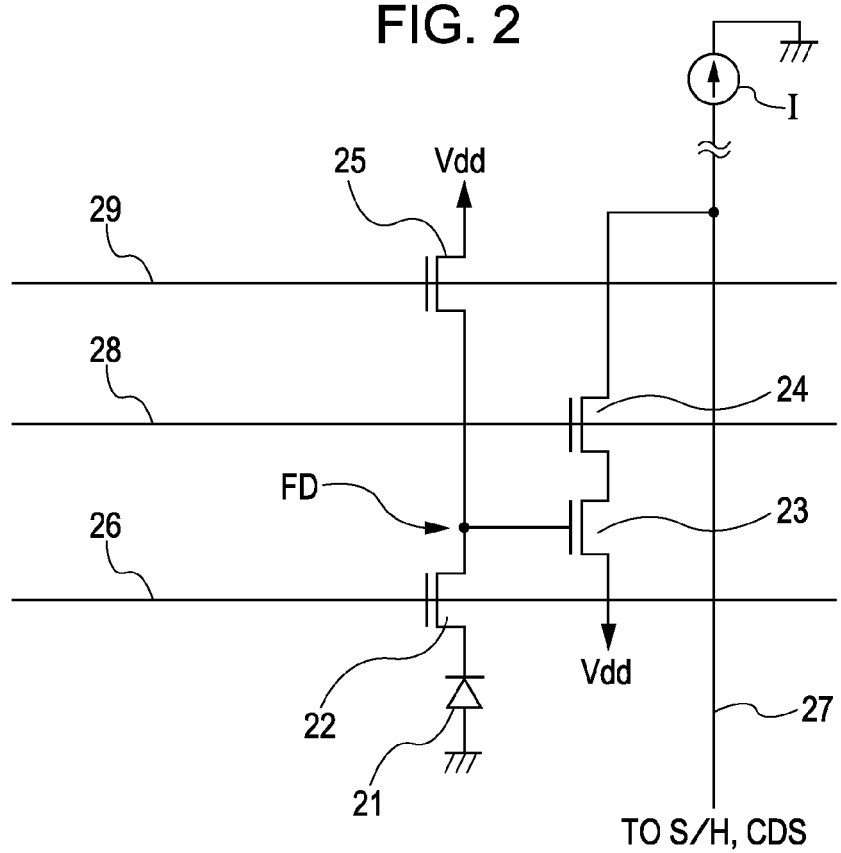
FIG. 2 is a schematic view illustrating one example of a circuit structure of a unit pixel of a pixel portion.

FIG. 2 is a schematic view illustrating one example of a circuit structure of a unit pixel of the pixel portion 2. The unit pixel includes, for example, a photodiode 21 as a photoelectric conversion element, and in addition, four transistors, that is, a transfer transistor 22, an amplifying transistor 23, an address transistor 24, and a reset transistor 25, are also included as active elements for this one photodiode 21.

The photodiode 21 performs photoelectric conversion of incident light into charges (electrons in this case) in an amount corresponding to the amount of the incident light. The transfer transistor 22 is connected between the photodiode 21 and a floating diffusion FD. In addition, when a drive signal is supplied to the gate (transfer gate) of the transfer transistor 22 through a drive wire 26, electrons which are photoelectric-converted by the photodiode 21 are transferred to the floating diffusion FD.

The gate of the amplifying transistor 23 is connected to the floating diffusion FD. The amplifying transistor 23 is connected to a vertical signal line 27 through the address transistor 24 and forms a source follower with a constant current power source I located outside the pixel portion. When an address signal is supplied to the gate of the address transistor 24 through a drive wire 28, and the address transistor 24 is turned on thereby, the amplifying transistor 23 amplifies the potential of the floating diffusion FD and outputs a voltage corresponding to the amplified potential to the vertical signal line 27. The voltage output from each pixel through the vertical signal line 27 is output to the S/H·CDS circuit 4.

The reset transistor 25 is connected between a power source Vdd and the floating diffusion FD. When a reset signal is supplied to the gate of the reset transistor 25 through a drive wire 29, the potential of the floating diffusion FD is reset to a power source potential Vdd. Since the gates of the transfer transistors 22, the gates of the address transistors 24, and the gates of the reset transistors 25 are respectively connected to each other in each row unit, the operations described above are simultaneously carried out for the pixels in one row.

Figure 3:
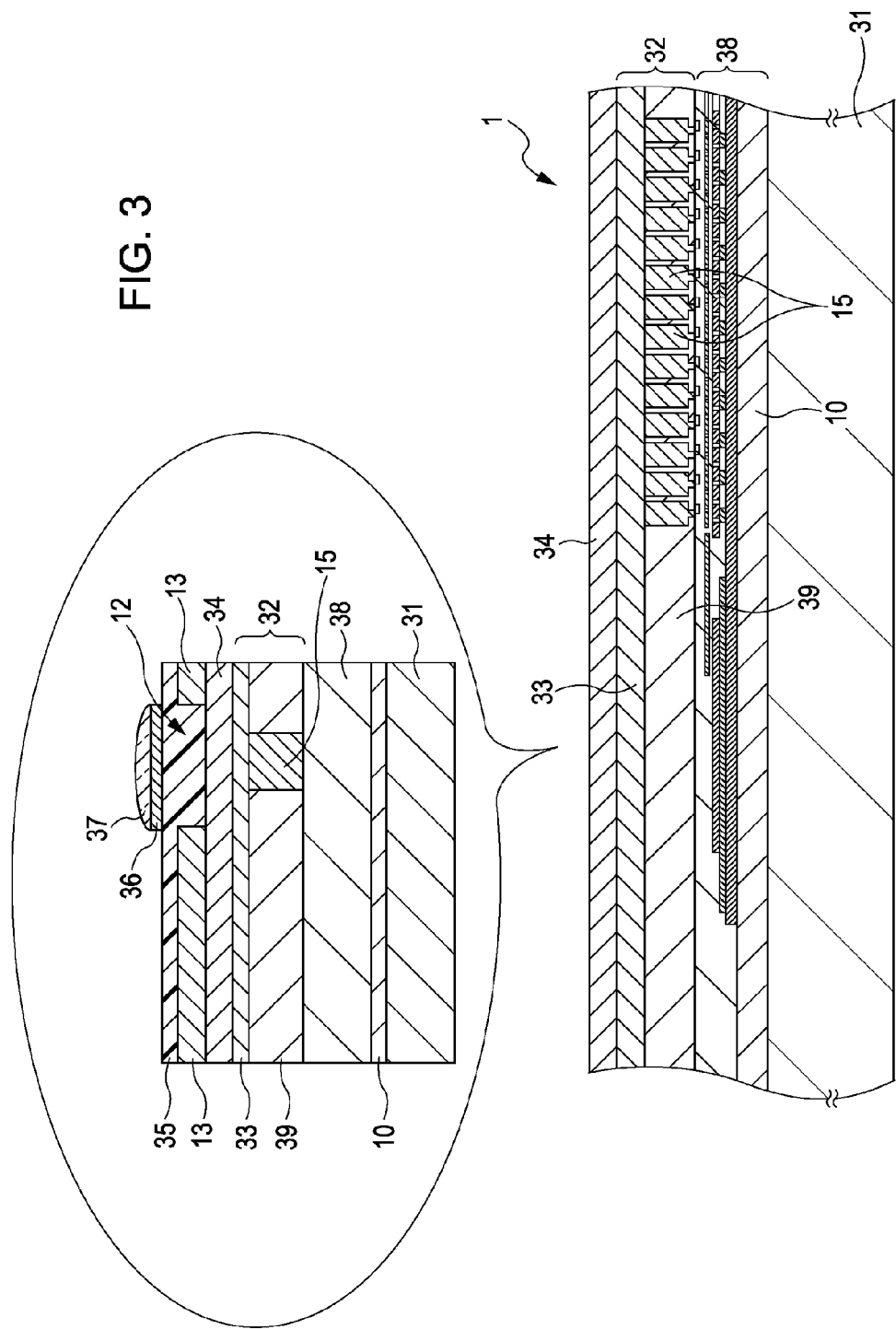
FIG. 3 is a schematic cross-sectional view illustrating the rear surface irradiation type solid-state image pick-up device which is one example of the solid-state image pick-up device according to an embodiment of the present invention.

FIG. 3 is a schematic cross-sectional view illustrating the rear surface irradiation type solid-state image pick-up device 1 which is one example of the solid-state image pick-up device according to an embodiment of the present invention.

In the rear surface irradiation type solid-state image pick-up device, a surface (hereinafter referred to as a "rear surface" of a semiconductor substrate main body) opposite to a surface (hereinafter referred to as a "surface" of the semiconductor substrate main body) on which a wiring layer 38 is formed receives light.

The solid-state image pick-up device 1 shown in FIG. 3 is primarily formed of a semiconductor support substrate 31, a semiconductor substrate main body 32, a hafnium oxide film 34, a passivation film 35, a color filter 36, and a microlens 37.

Incidentally, only in a partially enlarged view, a shading film 13, the passivation film 35, the color filter 36, and the microlens 37, which are provided over the hafnium oxide film 34, are shown.

The semiconductor substrate main body 32 is formed of n-type silicon. In addition, the semiconductor substrate main body 32 has an element forming layer 39 in which a plurality of light receiving portions 15 and active elements (not shown), such as MOS transistors, which convert signal charges photoelectric-converted by the light receiving portions into electrical signals and output these electrical signals, and the light receiving portions 15 and the active elements form the unit pixels. Furthermore, a gettering layer 33 is formed on the element forming layer 39 at a light incident side (rear surface side of the semiconductor substrate main body).

In addition, the light receiving portion 15 corresponds to the photodiode 21 shown in FIG. 2 and is formed by a pn junction in the semiconductor substrate main body 32.

In this embodiment, the semiconductor substrate main body 32 is formed by decreasing the thickness of a silicon wafer so as to make light incident from the rear surface.

Although the thickness of the semiconductor substrate main body 32 changes depending on the type of solid-state image pick-up device, the thickness thereof is 2 to 6 μm for visible light use and is 6 to 10 μm for infrared use.

In addition, the wiring layer 38 which performs multilayer electrical wiring of the active elements, such as MOS transistors, is formed on the surface of the semiconductor substrate main body 32. In addition, the semiconductor support substrate 31 is adhered to the wiring layer 38 with a silicon dioxide layer 10 interposed therebetween.

The semiconductor support substrate 31 is provided to reinforce the strength of the semiconductor substrate main body 32 and is formed, for example, of a silicon substrate, and the thickness thereof is, for example, approximately 725 μm.

In addition, the hafnium oxide film 34 is formed on the rear surface of the semiconductor substrate main body 32.

The hafnium oxide film 34 is one example of a dielectric film and places the surface of the gettering layer 33 and its vicinity in a positive charge accumulation state.

Furthermore, the shading film 13 which has visible light incident apertures 12 in regions corresponding to the light receiving portions is formed on the hafnium oxide film 34, and the passivation film 35 is formed on the shading film 13. In addition, the color filter 36 and the microlens 37 are formed in a region corresponding to the visible light incident aperture 12.

Figure 4:
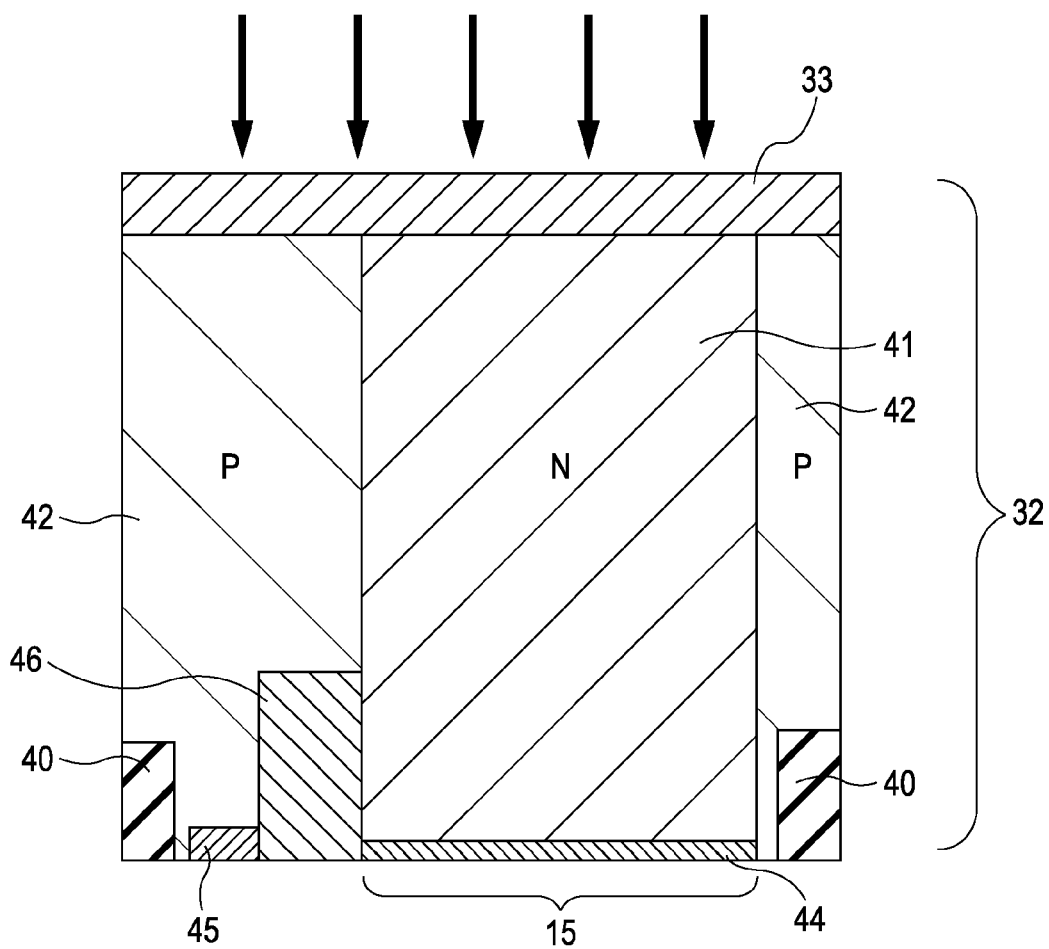
FIG. 4 is a cross-sectional view (1) of an important part of the pixel portion of a semiconductor substrate main body.

FIG. 4 is a cross-sectional view of an important part of the pixel portion of the semiconductor substrate main body 32.

In the region of the light receiving portion 15, an n-type charge accumulation region 41 is formed in the semiconductor substrate main body 32. In order to place the region in which signal charges are stored closer to the surface side of the semiconductor substrate main body 32, the charge accumulation region 41 is preferably formed so that the impurity concentration is gradually increased toward the surface side of the semiconductor substrate main body 32. In addition, in order to efficiently receive incident light, the charge accumulation region 41 may be formed so that the area thereof is gradually increased toward the rear surface side of the semiconductor substrate main body 32.

In the semiconductor substrate main body 32, a p-type well 42 is formed around the charge accumulation region 41. In addition, in the region of the light receiving portion 15, a shallow p-type hole accumulation region 44 is formed in the semiconductor substrate main body 32 at the surface side.

In addition, an element isolation insulating film 40 made of silicon oxide is formed in the semiconductor substrate main body 32 at the surface side. Furthermore, an n-type floating diffusion (FD) 45 is formed in the semiconductor substrate main body 32 at the surface side.

In addition, a p-type region 46 is formed between the floating diffusion 45 and the charge accumulation region 41, and hence they are electrically isolated from each other.

Figure 6A:
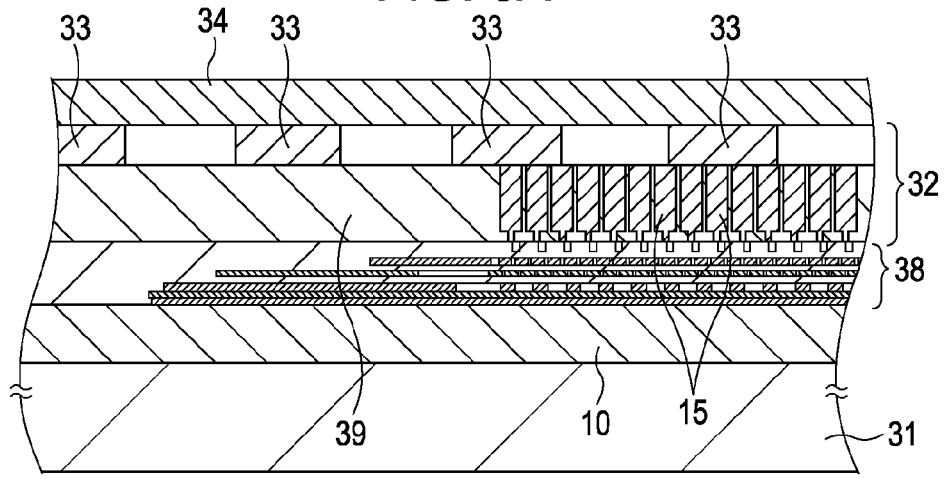
FIGS. 6A to 6C are schematic cross-sectional views illustrating a modified example according to a first embodiment.

In this first embodiment, the case in which the gettering layer 33 is formed on the entire surface of the element forming layer 39 is described by way of example. However, it is sufficient when the gettering layer 33 can suppress metal contamination, which is caused by heave metals, of devices (such as photodiodes) formed in the element forming layer 39. Accordingly, the gettering layer 33 may not be necessarily formed on the entire surface of the element forming layer 39, and as shown in FIG. 6A, the gettering layer 33 may be partially formed on the element forming layer 39 at the incident light side (the rear surface side of the semiconductor substrate main body). However, in consideration of the case in which the gettering layer 33 is used as an etching stopper in wet etching as describe later, the gettering layer 33 is preferably formed on the entire surface of the element forming layer 39.

Figure 6B:
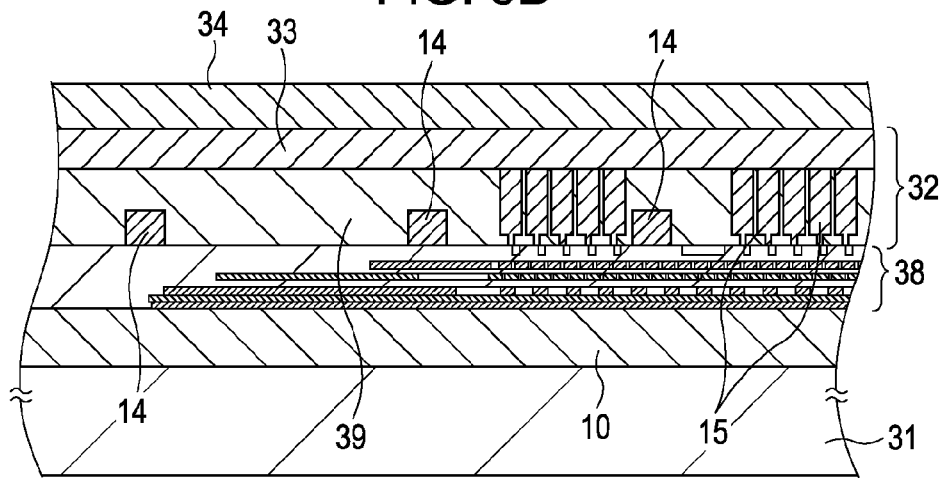

In addition, in the first embodiment, the case in which the gettering layer 33 is formed on the element forming layer 39 only at the light incident side (the rear surface side of the semiconductor substrate main body) is described by way of example. However, as shown in FIG. 6B, besides the gettering layer formed on the element forming layer 39 at the light incident side, gettering portions 14 may also be formed in the element forming layer 39.

When the gettering portions 14 are formed in the element forming layer 39, in order to prevent adverse influences caused by the flow of electrons generated due to crystalline defects of the gettering portions 14 into the light receiving portion, the gettering portions 14 are each necessarily formed to ensure a predetermined distance from the light receiving portion.

Figure 6C:
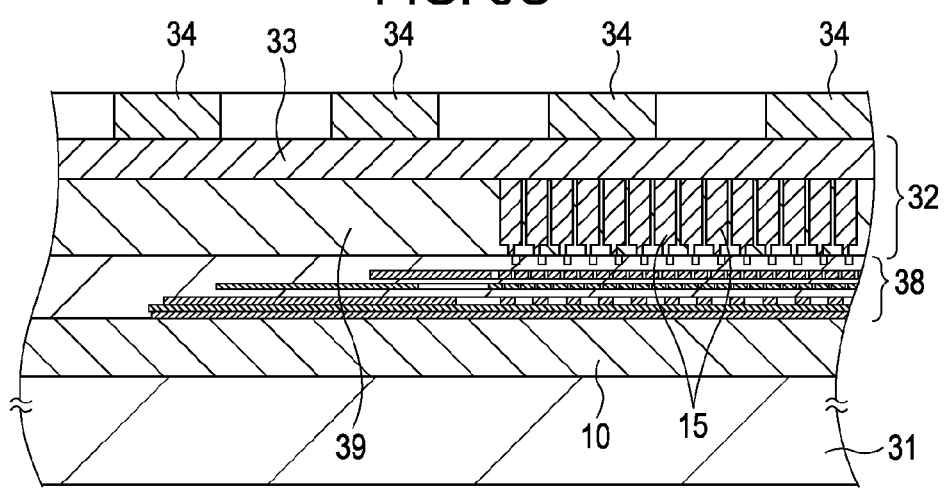

Furthermore, in the first embodiment, the case in which the hafnium oxide film 34 is formed on the entire surface of the semiconductor substrate main body 32 is described by way of example. However, it is sufficient when the hafnium oxide film 34 places the surface of the gettering layer 33 and its vicinity in a positive charge accumulation state, and hence the hafnium oxide film 34 may not be necessarily formed over the entire surface of the semiconductor substrate main body 32. Accordingly, as shown in FIG. 6C, the hafnium oxide film 34 may also be partially formed on an upper layer of the gettering layer 33.

In addition, in the first embodiment, although the case in which the hafnium oxide film 34 is formed is described by way of example, since it is sufficient when the surface of the gettering layer 33 and its vicinity can be placed in a positive charge accumulation state, another film may also be used instead of the hafnium oxide film 34.

As a film having negative fixed charges, besides a hafnium oxide film, for example, an oxide insulating film made of an element selected from zirconium, aluminum, tantalum, titanium, yttrium, and lanthanide may also be used.

In addition, in the first embodiment, since the light receiving portion 15 (charge accumulation region 41) is an n-type region, in order to place the surface of the gettering layer 33 and its vicinity in a positive charge accumulation state, the hafnium oxide film 34 is formed on the upper layer of the gettering layer 33. However, when the light receiving portion 15 is a p-type region, the surface of the gettering layer 33 and its vicinity are preferably placed in a negative charge accumulation state; hence, a dielectric film which places the surface of the gettering layer 33 and its vicinity in a negative charge accumulation state is to be formed on the upper layer of the gettering layer 33.

[Operation of the Solid-State Image Pick-Up Device]

Hereinafter, the operation of the solid-state image pick-up device having the above structure will be described.

First, in a charge accumulation period, light incident from the rear surface side of the semiconductor substrate main body 32 is photoelectric-converted by the light receiving portion 15, and signal charges in an amount corresponding to the amount of the incident light are generated. The signal charges generated by the photoelectric conversion drift in the charge accumulation region 41 and are stored therein in the vicinity of the hole accumulation region 44.

In the charge accumulation period, a negative voltage is applied to the gate electrode of the transfer transistor 22, and the transfer transistor 22 is placed in an OFF state.

Next, when a reading operation is performed, a positive voltage is applied to the gate electrode of the transfer transistor 22, and the transfer transistor 22 is placed in an ON state. As a result, the signal charges stored in the light receiving portion 15 are transferred to the floating diffusion 45.

The positive voltage is, for example, a power source voltage (3.3 V or 2.7 V).

In this case, in accordance with the amount of the signal charges transferred to the floating diffusion 45, the potential thereof changes. In addition, the potential of the floating diffusion 45 is amplified by the amplifying transistor 23, and a voltage corresponding to the amplified potential is output to the vertical signal line 27.

Subsequently, when a reset operation is performed, a positive voltage is applied to the gate electrode of the reset transistor 25, and the potential of the floating diffusion 45 is reset to the voltage of the power source Vdd. In this step, by applying a negative voltage to the gate electrode of the transfer transistor 22, the transfer transistor 22 is placed in an OFF state.

The charge accumulation period, the reading operation, and the reset operation are repeatedly performed.

[Manufacturing Method (1) of the Solid-State Image Pick-Up Device]

Hereinafter, a manufacturing method of the solid-state image pick-up device having the above structure will be described. That is, one example of a manufacturing method of the solid-state image pick-up device according to an embodiment of the present invention will be described.

Figure 5A:
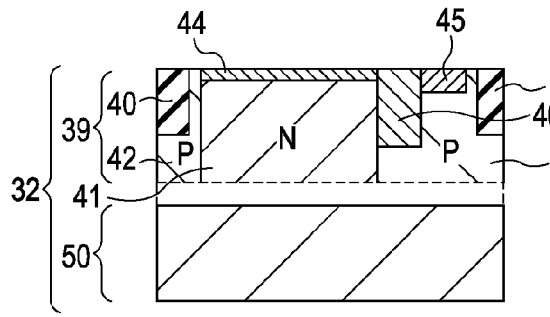
FIGS. 5A to 5E are schematic cross-sectional views illustrating one example of a manufacturing method of the solid-state image pick-up device according to an embodiment of the present invention.

In a manufacturing method (1) of the solid-state image pick-up device according to an embodiment of the present invention, as shown in FIG. 5A, the element isolation insulating film 40 is formed by a shallow trench isolation (STI) technique in the semiconductor substrate main body 32 which includes the element forming layer 39 and a thin film-forming removal layer 50. Next, by ion implantation methods, the n-type charge accumulation region 41, the p-type well 42, the p-type hole accumulation region 44, the floating diffusion 45, and the p-type region 46 are formed.

The formation order of the above regions is not particularly limited.

Figure 5D:
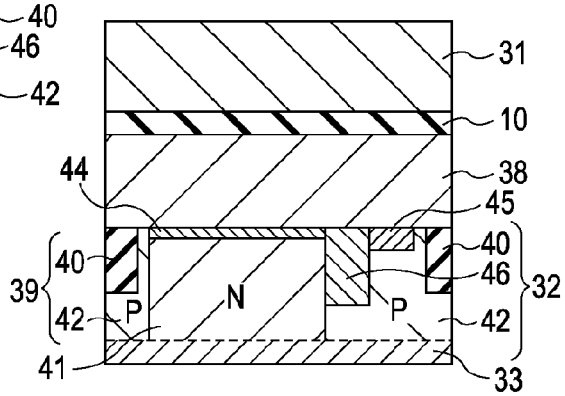
Figure 5B:
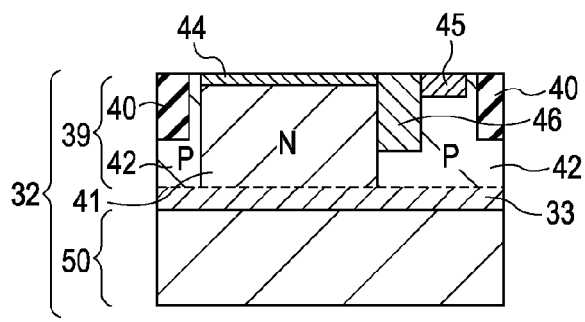

Subsequently, as shown in FIG. 5B, the gettering layer 33 is formed between the element forming layer 39 and the thin film-forming removal layer 50. In particular, for example, after boron (B) ions or phosphorus (P) ions are implanted at a high energy, the implanted impurities are activated by a heat treatment using an arc lamp annealing device or the like, so that the gettering layer 33 is formed.

In this manufacturing method, although the case in which after the individual regions are formed in the element forming layer 39, the gettering layer 33 is formed is described by way of example, the individual regions may be formed in the element forming layer 39 after the gettering layer 33 is formed.

In addition, although the gettering layer 33 is formed in such a way that after boron (B) ions or phosphorus (P) ions are implanted at a high energy, the heat treatment is performed using an arc lamp annealing device or the like, the method for forming the gettering layer 33 is not limited to that described above. For example, the gettering layer 33 may be formed in such a way that after group IV ions, such as carbon ions or Si ions, are implanted, heat diffusion is performed at approximately 1,000 to 1,150° C.

Next, insulation films and wires are repeatedly formed on the surface of the semiconductor substrate main body 32, so that the wiring layer 38 is formed. Subsequently, the semiconductor support substrate 31 made of silicon is adhered to the wiring layer 38 with the silicon dioxide layer 10 interposed therebetween (see FIG. 5C).

Next, as shown in FIG. 5D, the thin film-forming removal layer 50 is removed by a wet etching method, so that the gettering layer 33 is exposed. Since an impurity region which is heavily doped with impurities, such as boron (B) ions or phosphorus (P) ions, is able to function as an etching stopper, the gettering layer 33 functions as an etching stopper in the wet etching.

Figure 5E:
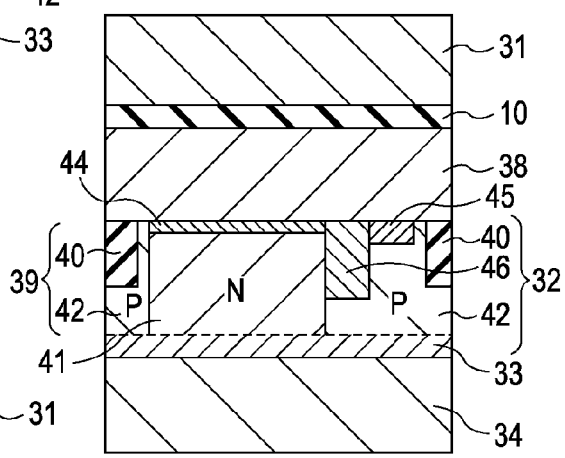
Figure 5C:
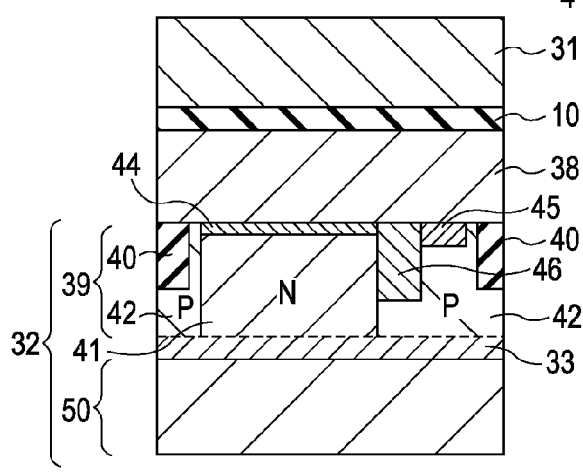

Subsequently, the hafnium oxide film 34 is formed on the rear surface of the semiconductor substrate main body 32 (see FIG. 5E).

The hafnium oxide film 34 is formed, for example, by an atomic layer deposition method. In addition, when the hafnium oxide film 34 is formed, a silicon oxide film (not shown) having a very small thickness is formed on the rear surface of the semiconductor substrate main body 32.

Next, the shading film 13 is formed on the hafnium oxide film 34, and a pattern processing is performed on the shading film 13 to form the visible light incident apertures 12 corresponding to the light receiving portions. Furthermore, the passivation film 35 is formed on the shading film 13 by a CVD method, and the color filters 36 and the microlenses 37 are also formed, so that the solid-state image pick-up device shown in FIG. 3 is obtained.

Solid-state image pick-up devices comprising the semiconductor substrate main body 32 of a wafer level are separated into chips by dicing the wafer, and the chips thus separated are each processed by mounting, bonding, and sealing, so that the individual solid-state image pick-up devices can be formed.

[Manufacturing Method (2) of the Solid-State Image Pick-Up Device]

Hereinafter, another manufacturing method of the solid-state image pick-up device having the above structure will be described. That is, another example of the manufacturing method of the solid-state image pick-up device according to an embodiment of the present invention will be described.

Figure 5F:
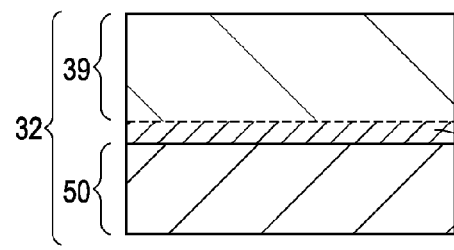
FIGS. 5F to 5J are schematic cross-sectional views illustrating another example of the manufacturing method of the solid-state image pick-up device according to an embodiment of the present invention.

In a manufacturing method (2) of the solid-state image pick-up device according to an embodiment of the present invention, as shown in FIG. 5F, when the semiconductor substrate main body 32 is manufactured, the gettering layer 33 is formed between the element forming layer 39 and the thin film-forming removal layer 50 of the semiconductor substrate main body 32. In particular, for example, after boron (B) ions or phosphorus (P) ions are implanted at a high energy, the implanted impurities are activated by a heat treatment using an arc lamp annealing device or the like, so that the gettering layer 33 is formed.

That is, in the manufacturing method (1) of the solid-state image pick-up device according to an embodiment of the present invention, the gettering layer 33 is formed in a wafer process. On the other hand, in the manufacturing method (2) of the solid-state image pick-up device according to an embodiment of the present invention, the gettering layer 33 is formed in a substrate manufacturing process which is performed before a wafer process.

This method for forming the gettering layer 33 will be described with reference to a particular example.

In general, the semiconductor substrate main body 32 used for a solid-state image pick-up device is provided with an epitaxial film (not shown) thereon. In other words, the semiconductor substrate main body 32 provided with an epitaxial film grown thereon is variously processed in a wafer process. In the manufacturing method (1) of the solid-state image pick-up device according to an embodiment of the present invention, since the gettering layer 33 is formed in a wafer process, after an epitaxial film is formed on the semiconductor substrate main body 32, the gettering layer 33 is formed. On the other hand, in the manufacturing method (2) of the solid-state image pick-up device according to an embodiment of the present invention, in order to form the gettering layer 33 in a substrate manufacturing process, the gettering layer 33 is formed in the semiconductor substrate main body 32, and an epitaxial film is then formed on the semiconductor substrate main body 32.

Figure 5G:
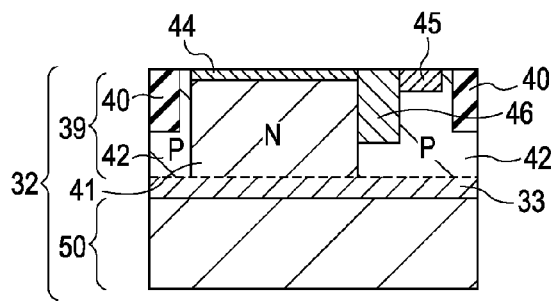

Next, as shown in FIG. 5G, the element isolation insulating film 40 is formed by an STI technique in the element forming layer 39 of the semiconductor substrate main body 32. In addition, by ion implantation methods, the n-type charge accumulation region 41, the p-type well 42, the p-type hole accumulation region 44, the floating diffusion 45, and the p-type region 46 are formed.

The formation order of the above regions is not particularly limited.

Figure 5H:
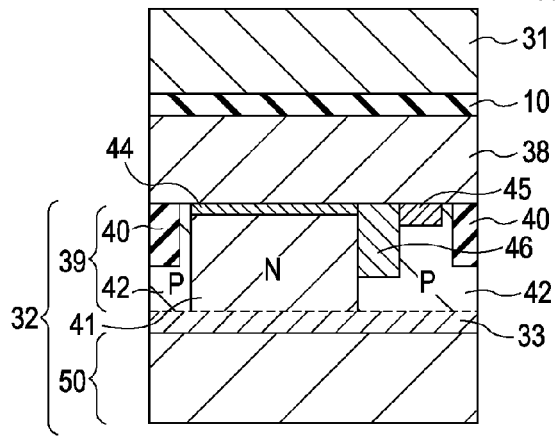

Subsequently, insulation films and wires are repeatedly formed on the surface of the semiconductor substrate main body 32, so that the wiring layer 38 is formed. Next, the semiconductor support substrate 31 made of silicon is adhered to the wiring layer 38 with the silicon dioxide layer 10 interposed therebetween (see FIG. 5H).

Figure 5I:
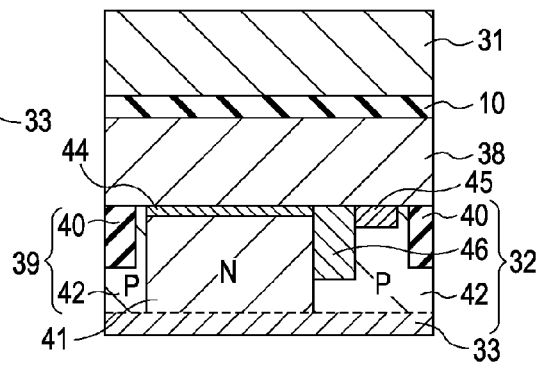

As shown in FIG. 5I, the thin film-forming removal layer 50 is then removed by a wet etching method, so that the gettering layer 33 is exposed. Since an impurity region which is heavily doped with impurities, such as boron (B) ions or phosphorus (P) ions, is able to function as an etching stopper, the gettering layer 33 functions as an etching stopper in the wet etching.

Figure 5J:
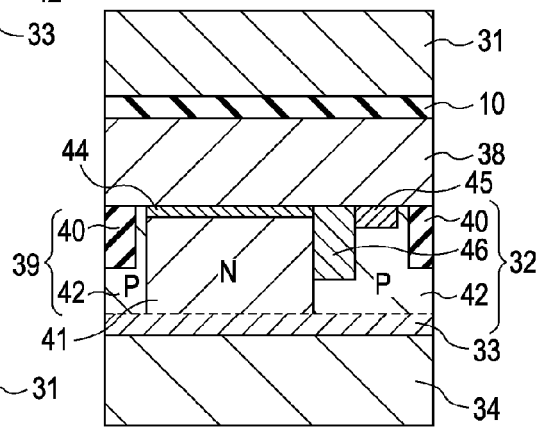

Next, the hafnium oxide film 34 is formed on the rear surface of the semiconductor substrate main body 32 (see FIG. 5J).

The hafnium oxide film 34 is formed, for example, by an atomic layer deposition method. In addition, when the hafnium oxide film 34 is formed, a silicon oxide film (not shown) having a very small thickness is formed on the rear surface of the semiconductor substrate main body 32.

Next, the shading film 13 is formed on the hafnium oxide film 34, and a pattern processing is performed on the shading film 13 to form the visible light incident apertures 12 corresponding to the light receiving portions. Furthermore, the passivation film 35 is formed on the shading film 13 by a CVD method, and the color filters 36 and the microlenses 37 are also formed, so that the solid-state image pick-up device shown in FIG. 3 is obtained.

Solid-state image pick-up devices comprising the semiconductor substrate main body 32 of a wafer level are separated into chips by dicing the wafer, and the chips thus separated are each processed by mounting, bonding, and sealing, so that the individual solid-state image pick-up devices can be formed.

In this first embodiment, the case in which the thin film-forming removal layer 50 is removed by etching using the gettering layer 33 as an etching stopper is described by way of example. However, a wet etching method may not be necessarily used as the method for removing the thin film-forming removal layer 50, and for example, the thin film-forming removal layer 50 may be removed by a mechanical polishing using a CMP method. The method for removing the thin film-forming removal layer 50 described above may be applied to both the manufacturing methods (1) and (2) of the solid-state image pick-up device according to an embodiment of the present invention.

In addition, in the first embodiment, the gettering layer 33 is formed between the element forming layer 39 and the thin film-forming removal layer 50, and the thin film-forming removal layer 50 is then removed, so that the gettering layer 33 is exposed. However, it is sufficient when the gettering layer 33 can be formed on the upper layer (incident light side) of the element forming layer 39, and hence the gettering layer 33 may be formed on the upper layer (incident light side) of the element forming layer 39 by using the semiconductor substrate main body 32 including no thin film-forming removal layer 50. However, since the semiconductor substrate main body 32 including no thin film-forming removal layer 50 has a thickness of approximately 10 μm, it is believed that the handling of the semiconductor substrate main body 32 is considerably difficult in a manufacturing process. Hence, in consideration of the convenience of handling the semiconductor substrate main body 32 in a manufacturing process, it may be preferable that after the semiconductor substrate main body 32 having the thin film-forming removal layer 50 is used and is then adhered to the semiconductor support substrate 31, the thin film-forming removal layer 50 be removed. The method for forming the gettering layer 33 described above may be applied to both the manufacturing methods (1) and (2) of the solid-state image pick-up device according to an embodiment of the present invention.

In the example of the solid-state image pick-up device according to an embodiment of the present invention, since the gettering layer 33 is formed, metal contamination caused by heavy metals can be prevented in various processes after the thin film-forming removal layer 50 is removed.

In addition, since the hafnium oxide film 34 is formed on the upper layer of the gettering layer 33, electrons generated due to crystalline defects of the gettering layer 33 are suppressed from flowing into the light receiving portion. In particular, the hafnium oxide film 34 has a negative fixed charge therein, and because of this negative fixed charge, the surface of the gettering layer 33 and its vicinity are placed in a positive charge accumulation state. Hence, even if electrons are generated due to crystalline defects of the gettering layer 33, the electrons thus generated can be combined with holes in the region placed in the positive charge accumulation state, and as a result, the electrons are suppressed from flowing into the light receiving portion. Accordingly, noises of the solid-state image pick-up device are reduced, and the S/N ratio of the device can be improved.

In addition, since electrons are suppressed from flowing into the light receiving portion by the hafnium oxide film 34, the degree of device design freedom can be increased, and the device characteristics can also be improved.

In particular, for example, according to the technique disclosed in Japanese Unexamined Patent Application Publication No. 2007-88450, in order to suppress noises caused by crystalline defects of the gettering layer, a hole accumulation region, which is a p-type region, is formed in the element forming layer at an incident light side (rear surface side of the semiconductor substrate main body). However, since the hole accumulation region is formed as described above, the degree of device design freedom is decreased, and in addition, since the area for forming the light receiving portion is reduced, the device characteristics are degraded. On the other hand, when electrons are suppressed from flowing into the light receiving portion by the hafnium oxide film 34, the hole accumulation region may not be necessarily formed in the element forming layer 39, and as described above, the degree of device design freedom is increased, and the device characteristics can also be improved.

Furthermore, since the hafnium oxide film 34 also functions as an antireflection film, when the hafnium oxide film 34 is formed, an antireflection film may not be additionally formed.

2. Second Embodiment

Structure of a Semiconductor Device

FIG. 7 is a schematic cross-sectional view illustrating one example of a semiconductor device according to an embodiment of the present invention. A semiconductor device 60 shown in this embodiment is, for example, RAM, ROM, or LSI and is primarily formed of a semiconductor support substrate 61, a semiconductor substrate main body 62, and a hafnium oxide film 63.

The semiconductor substrate main body 62 is formed of n-type silicon. In addition, the semiconductor substrate main body 62 has an element forming layer 65 in which n-type devices 64, such as a logic element, an active element, and a passive element, are formed. Furthermore, a gettering layer 66 is formed on the element forming layer 65.

Although the thickness of the semiconductor substrate main body 62 changes depending on the type of semiconductor device, the thickness necessary for forming a device is approximately 10 μm.

In addition, a wiring layer 67 performing multilayer electrical wiring of the devices 64 is formed on one surface (surface indicated by the mark A) of the semiconductor substrate main body 62. In addition, the semiconductor support substrate 61 is adhered to the wiring layer 67 with a silicon dioxide layer 68 interposed therebetween.

The semiconductor support substrate 61 is provided to reinforce the strength of the semiconductor substrate main body 62 and is formed, for example, of a silicon substrate, and the thickness thereof is for example, approximately 725 μm.

In addition, the hafnium oxide film 63 is formed on the other surface (surface indicated by the mark B) of the semiconductor substrate main body 62.

In this embodiment, as in the case of the first embodiment described above, the gettering layer 66 may not be necessarily formed on the entire surface of the element forming layer 65 and may be partially formed thereon. However, in consideration of the case in which the gettering layer 66 is used as an etching stopper in wet etching as describe later, the gettering layer 66 is preferably formed on the entire surface of the element forming layer 65.

In addition, as in the first embodiment described above, gettering portions may also be formed in the element forming layer 65 besides the gettering layer 66 formed on the element forming layer 65. However, when electrons generated due to crystalline defects of the gettering portions formed in the element forming layer 65 may adversely influence the devices in some cases, the gettering portions are each necessarily formed to ensure a predetermined distance from the devices.

Furthermore, as in the first embodiment, when the surface of the gettering layer 66 and its vicinity can be placed in a positive charge accumulation state, the hafnium oxide film 63 may not be necessarily formed on the entire surface of the semiconductor substrate main body 62. In addition, also as in the first embodiment, when the surface of the gettering layer 66 and its vicinity can be placed in a positive charge accumulation state, another film may also be used instead of the hafnium oxide film 63.

In the second embodiment, since the devices 64 are each an n type, the hafnium oxide film 63 is formed on an upper layer of the gettering layer 66 in order to place the surface of the gettering layer 66 and its vicinity in a positive charge accumulation state. However, when the devices 64 are each a p type, since the surface of the gettering layer 66 and its vicinity are necessarily placed in a negative charge accumulation state, a dielectric film which can place the surface of the gettering layer 66 and its vicinity in a negative charge accumulation region is formed on the upper layer of the gettering layer 66.

[Manufacturing Method (1) of the Semiconductor Device]

Hereinafter, a manufacturing method of the semiconductor device having the above structure will be described. That is, one example of a method for manufacturing the semiconductor device according to an embodiment of the present invention will be described.

Figure 8A:
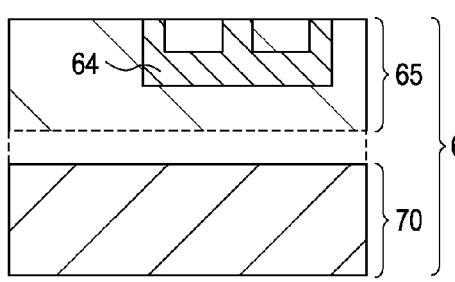
FIGS. 8A to 8D are schematic cross-sectional views illustrating one example of a manufacturing method of the semiconductor device according to an embodiment of the present invention.

In a method (1) for manufacturing the semiconductor device according to an embodiment of the present invention, as shown in FIG. 8A, the device 64 is formed in the semiconductor substrate main body 62 which includes the element forming layer 65 and a thin film-forming removal layer 70.

Figure 8B:
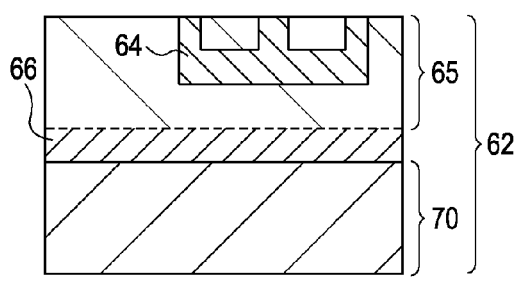

Subsequently, as shown in FIG. 8B, the gettering layer 66 is formed between the element forming layer 65 and the thin film-forming removal layer 70. In particular, for example, after boron (B) ions or phosphorus (P) ions are implanted at a high energy, the implanted impurities are activated by a heat treatment using an arc lamp annealing device or the like, so that the gettering layer 66 is formed.

In this embodiment, although the case in which after the device 64 is formed in the element forming layer 65, the gettering layer 66 is formed is described by way of example, the device 64 may be formed in the element forming layer 65 after the gettering layer 66 is formed.

In addition, although the gettering layer 66 is formed in such a way that after boron (B) ions or phosphorus (P) ions are implanted at a high energy, the heat treatment is performed using an arc lamp annealing device or the like, the method for forming the gettering layer 66 is not limited to that described above. For example, the gettering layer 66 may be formed in such a way that after group IV ions, such as carbon ions or Si ions, are implanted, heat diffusion is performed at approximately 1,000 to 1,150° C.

Figure 8C:
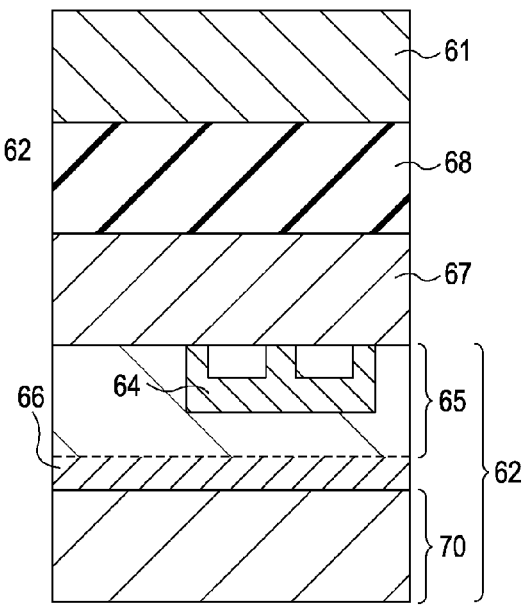

Next, insulation films and wires are repeatedly formed on one surface of the semiconductor substrate main body 62, so that the wiring layer 67 is formed. Subsequently, the semiconductor support substrate 61 made of silicon is adhered to the wiring layer 67 with the silicon dioxide layer 68 interposed therebetween (see FIG. 8C).

Figure 8D:
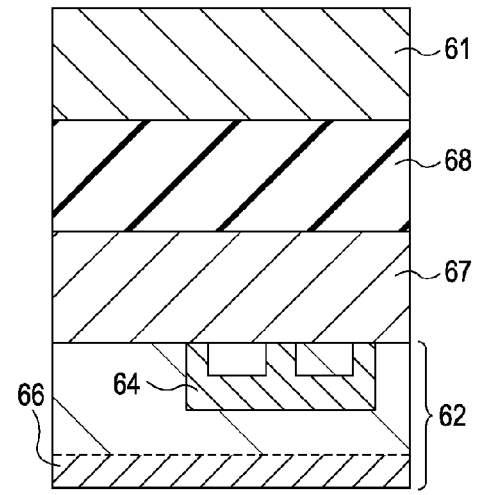

Subsequently, as shown in FIG. 8D, the thin film-forming removal layer 70 is removed by a wet etching method, so that the gettering layer 66 is exposed. In this wet etching, the gettering layer 66 functions as an etching stopper.

Next, the hafnium oxide film 63 is formed on the other surface of the semiconductor substrate main body 62, so that the semiconductor device shown in FIG. 7 can be obtained. In this case, the hafnium oxide film 63 may be formed, for example, by an atomic layer deposition method.

Semiconductor devices comprising the semiconductor substrate main body 62 of a wafer level are separated into chips by dicing the wafer, and the chips thus separated are each processed by mounting, bonding, and sealing, so that the individual semiconductor devices can be formed.

[Manufacturing Method (2) of the Semiconductor Device]

Hereinafter, another method for manufacturing the semiconductor device having the above structure will be described. That is, another example of the method for manufacturing the semiconductor device according to an embodiment of the present invention will be described.

Figure 8E:
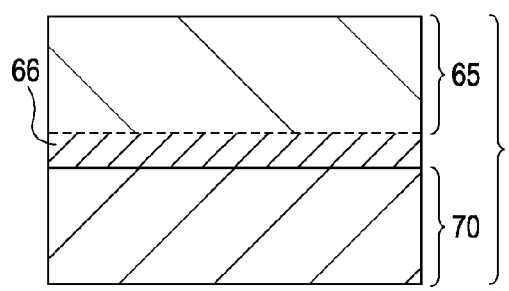
FIGS. 8E to 8H are schematic cross-sectional views illustrating another example of the manufacturing method of the semiconductor device according to an embodiment of the present invention.

In a method (2) for manufacturing the semiconductor device according to an embodiment of the present invention, as shown in FIG. 8E, when the semiconductor substrate main body 62 is formed, the gettering layer 66 is formed between the element forming layer 65 and the thin film-forming removal layer 70 of the semiconductor substrate main body 62. In particular, for example, after boron (B) ions or phosphorus (P) ions are implanted at a high energy, the implanted impurities are activated by a heat treatment using an arc lamp annealing device or the like, so that the gettering layer 66 is formed.

That is, in the method (1) for manufacturing the semiconductor device according to an embodiment of the present invention, the gettering layer 66 is formed in a wafer process. On the other hand, in the method (2) for manufacturing the semiconductor device according to an embodiment of the present invention, the gettering layer 66 is formed in a substrate manufacturing process which is performed before a wafer process.

This method for forming the gettering layer 66 will be described with reference to a particular example.

In general, the semiconductor substrate main body 62 used for a semiconductor device is provided with an epitaxial film (not shown) thereon. In other words, the semiconductor substrate main body 62 provided with an epitaxial film formed thereon is variously processed in a wafer process. In the manufacturing method (1) of the semiconductor device according to an embodiment of the present invention, in order to form the gettering layer 66 in a wafer process, after an epitaxial film is formed on the semiconductor substrate main body 62, the gettering layer 66 is formed. On the other hand, in the manufacturing method (2) of the semiconductor device according to an embodiment of the present invention, in order to form the gettering layer 66 in a substrate manufacturing process, the gettering layer 66 is formed in the semiconductor substrate main body 62, and an epitaxial film is then formed on the semiconductor substrate main body 62.

Figure 8G:
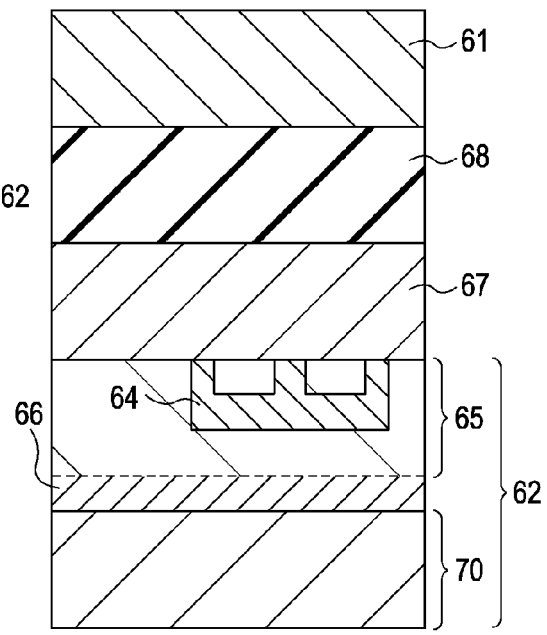
Figure 8F:
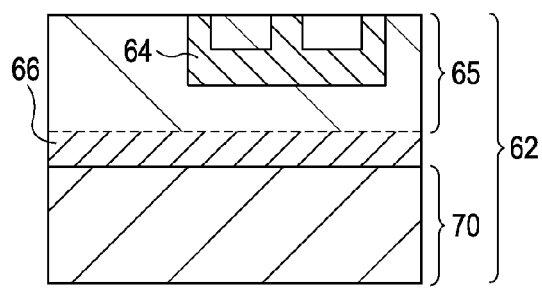

Subsequently, as shown in FIG. 8F, the device 64 is formed in the element forming layer 65 of the semiconductor substrate main body 62.

Next, insulation films and wires are repeatedly formed on one surface of the semiconductor substrate main body 62, so that the wiring layer 67 is formed. The semiconductor support substrate 61 made of silicon is then adhered to the wiring layer 67 with the silicon dioxide layer 68 interposed therebetween (see FIG. 8G).

Figure 8H:
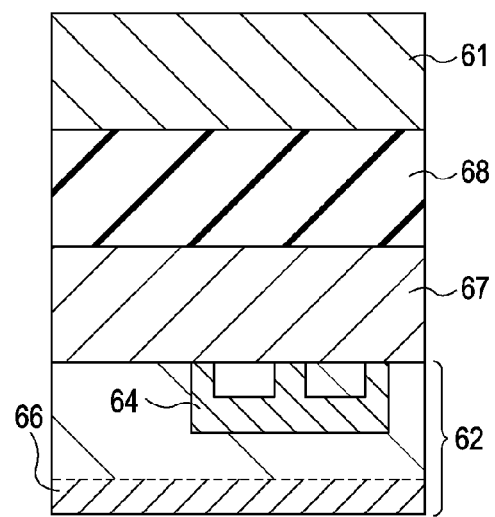

Subsequently, as shown in FIG. 8H, the thin film-forming removal layer 70 is removed by a wet etching method, so that the gettering layer 66 is exposed. In this wet etching, the gettering layer 66 functions as an etching stopper.

Next, the hafnium oxide film 63 is formed on the other surface of the semiconductor substrate main body 62, so that the semiconductor device shown in FIG. 7 can be obtained. In this case, the hafnium oxide film 63 may be formed, for example, by an atomic layer deposition method.

Semiconductor devices comprising the semiconductor substrate main body 62 of a wafer level are separated into chips by dicing the wafer, and the chips thus separated are each processed by mounting, bonding, and sealing, so that the individual semiconductor devices can be formed.

In this embodiment, as the method for removing the thin film-forming removal layer 70, a wet etching method may not be necessarily used. For example, the thin film-forming removal layer 70 may be removed by mechanical polishing using a CMP method, and as in the first embodiment described above, this method may be applied to both the manufacturing methods (1) and (2) of the semiconductor device according to an embodiment of the present invention.

In the example of the semiconductor device according to an embodiment of the present invention, since the gettering layer 66 is formed, after the thin film-forming removal layer 70 is removed, metal contamination caused by heavy metals can be prevented in various processes.

In addition, since the hafnium oxide film 63 is formed on the upper layer of the gettering layer 66, electrons generated due to crystalline defects of the gettering layer 66 are suppressed from flowing into the device. In particular, the hafnium oxide film 63 has a negative fixed charge therein, and because of the negative fixed charge, the surface of the gettering layer 66 and its vicinity are placed in a positive charge accumulation state. Hence, even if electrons are generated due to crystalline defects of the gettering layer 66, the electrons thus generated can be combined with holes in the region placed in a positive charge accumulation state, and as a result, the electrons are suppressed from flowing into the device. Accordingly, noises of the semiconductor device are reduced.

In addition, since electrons are suppressed from flowing into the device by the hafnium oxide film 63, the degree of device design freedom can be increased, and the device characteristics can also be improved.

In particular, for example, according to the technique disclosed in Japanese Unexamined Patent Application Publication No. 2007-88450, in order to suppress noises caused by crystalline defects of the gettering layer, the hole accumulation region, which is a p-type region, is formed in the element forming layer. However, since the hole accumulation region as described above is necessarily formed, the degree of device design freedom is decreased, and in addition, since the area for forming the device is reduced, the device characteristics are degraded. On the other hand, when electrons are suppressed from flowing into the device by the hafnium oxide film 63, the hole accumulation region may not be necessarily formed in the element forming layer 65, and as described above, the degree of device design freedom is increased, and the device characteristics are also improved.

3. Third Embodiment

Structure of a Camera

Figure 9:
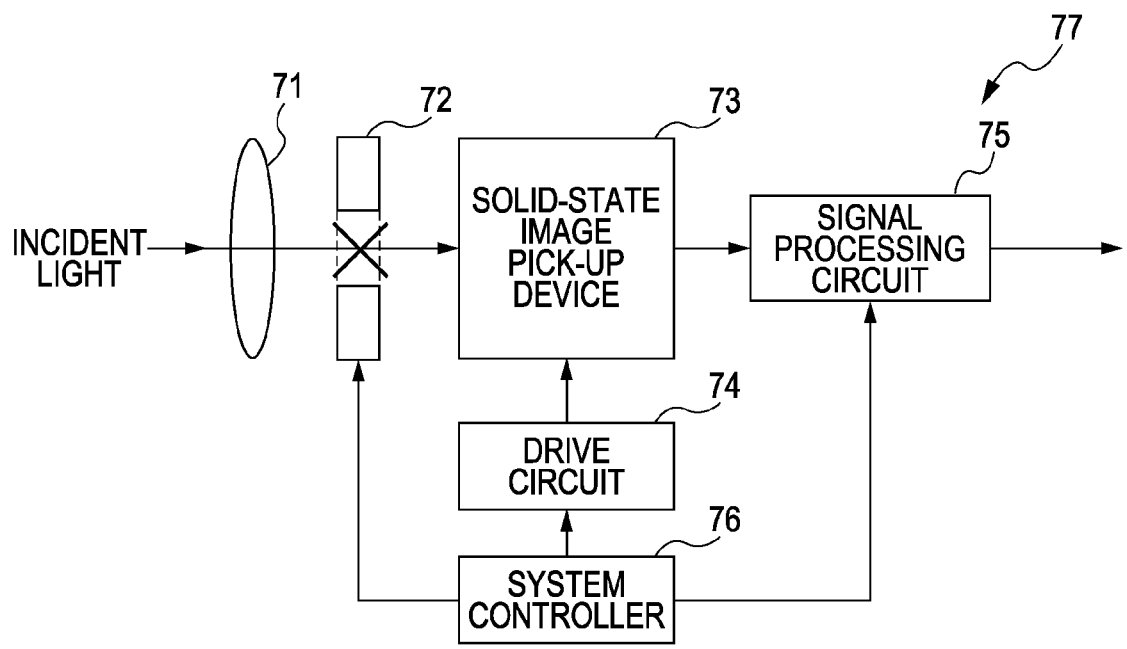
FIG. 9 is a schematic view illustrating a camera which is one example of an image pick-up apparatus according to an embodiment of the present invention.

FIG. 9 is a schematic view illustrating a camera 77 which is one example of an image pick-up apparatus according to an embodiment of the present invention. In this embodiment, the camera 77 thus shown uses the solid-state image pick-up device according to the first embodiment described above as an image pick-up device.

In the camera 77 using the solid-state image pick-up device according to the first embodiment of the present invention, light from an object (not shown) is incident on an image pick-up area of a solid-state image pick-up device 73 through an optical system, such as a lens 71, and a mechanical shutter 72. The mechanical shutter 72 blocks light incident on the image pick-up area of the solid-state image pick-up device 73 and determines an exposure time.

The solid-state image pick-up device 1 according to the first embodiment is used as the solid-state image pick-up device 73, and the solid-state image pick-up device 73 is driven by a drive circuit 74 including a timing generation circuit and a drive system.

In addition, an output signal of the solid-state image pick-up device 73 is processed by various signal processings by the following signal processing circuit 75 and is then sent outside as an image pick-up signal, and the image pick-up signal thus sent is stored in a recording medium, such as a memory, or is output to a monitor.

In addition, open and close control of the mechanical shutter 72, control of the drive circuit 74, control of the signal processing circuit 75, and the like are performed by a system controller 76.

Since the camera 77 described above uses the solid-state image pick-up device 1 according to the first embodiment of the present invention, metal contamination caused by heavy metals can be prevented in various processes, and hence a high-quality pickup image can be obtained.

In addition, since the hafnium oxide film 34 is formed on the upper layer of the gettering layer 33, electrons generated due to crystalline defects of the gettering layer 33 can be suppressed from flowing into the light receiving portion. Hence, noises of the solid-state image pick-up device can be reduced, and the S/N ratio of the device can be improved, so that a high-quality pickup image can be obtained.

Furthermore, since electrons can be suppressed by the hafnium oxide film 34 from flowing into the light receiving portion, the device characteristics can be improved, and as a result, a high-quality pickup image can be obtained.

Modified Example

In addition, in the third embodiment, although the case in which the solid-state image pick-up device according to the first embodiment is used as an image pick-up device is described by way of example, as the image pick-up device, a solid-state image pick-up device according to the following fourth embodiment may also be used.

4. Fourth Embodiment

Structure of a Solid-State Image Pick-Up Device

As in the first embodiment, a rear surface irradiation type solid-state image pick-up device 1 which is another example of the solid-state image pick-up device according to an embodiment of the present invention has the pixel portion 2 and the peripheral circuit portion, and these portions are mounted on the same semiconductor substrate. In the fourth embodiment, the peripheral circuit portion includes the vertical selection circuit 3, the S/H·CDS circuit 4, the horizontal selection circuit 5, the TG 6, the AGC circuit 7, the A/D converter circuit 8, and the digital amplifier 9 (see FIG. 1).

In the pixel portion 2, many unit pixels are disposed in a matrix form, address lines and the like are provided on a row basis, and signal lines and the like are provided on a column basis. The structure described above is the same as that in the first embodiment.

The vertical selection circuit 3 sequentially selects pixels on a row basis, and signals of individual pixels are read into the S/H·CDS circuit 4 for individual pixel columns through the vertical signal lines. The S/H·CDS circuit 4 performs a signal processing, such as CDS, on the pixel signals read from the individual pixel columns. The structure described above is also the same as that in the first embodiment.

The horizontal selection circuit 5 sequentially takes out the pixel signals held in the S/H·CDS circuit 4 and output the pixel signals to the AGC circuit 7. The AGC circuit 7 amplifies the signals input from the horizontal selection circuit 5 with an appropriate gain and outputs the amplified signals to the A/D converter circuit 8. The structure described above is also the same as that in the first embodiment.

The A/D converter circuit 8 converts the analog signals input from the AGC circuit 7 into digital signals and outputs the digital signals to the digital amplifier 9. The digital amplifier 9 appropriately amplifies the digital signals input from the A/D converter circuit 8 and outputs the amplified digital signals to pads (terminals). The structure described above is also the same as that in the first embodiment.

The operations of the vertical selection circuit 3, the S/H·CDS circuit 4, the horizontal selection circuit 5, the AGC circuit 7, the A/D converter circuit 8, and the digital amplifier 9 are performed based on various types of timing signals output from the timing generator 6. The structure described above is also the same as that in the first embodiment.

The unit pixel forming the pixel portion 2 includes, for example, the photodiode 21 as a photoelectric conversion element, and four transistors, that is, the transfer transistor 22, the amplifying transistor 23, the address transistor 24, and the reset transistor 25, are also included as active elements for this one photodiode 21 (see FIG. 2).

The photodiode 21 performs photoelectric conversion of incident light into charges (electrons in this case) in an amount corresponding to the amount of the incident light. The transfer transistor 22 is connected between the photodiode 21 and the floating diffusion FD. In addition, when a drive signal is supplied to the gate (transfer gate) of the transfer transistor 22 through the drive wire 26, electrons which are photoelectric-converted in the photodiode 21 are transferred to the floating diffusion FD. The structure described above is also the same as that in the first embodiment.

The gate of the amplifying transistor 23 is connected to the floating diffusion FD. The amplifying transistor 23 is connected to the vertical signal line 27 through the address transistor 24 and forms the source follower with the constant current power source I located outside the pixel portion. When an address signal is supplied to the gate of the address transistor 24 through the drive wire 28, and the address transistor 24 is turned on thereby, the amplifying transistor 23 amplifies the potential of the floating diffusion FD and outputs a voltage corresponding to the amplified potential to the vertical signal line 27. The voltage output from each pixel through the vertical signal line 27 is output to the S/H·CDS circuit 4. The structure described above is also the same as that in the first embodiment.

The reset transistor 25 is connected between the power source Vdd and the floating diffusion FD. When a reset signal is supplied to the gate of the reset transistor 25 through the drive wire 29, the potential of the floating diffusion FD is reset to the power source potential Vdd. Since the gates of the transfer transistors 22, the gates of the address transistors 24, and the gates of the reset transistors 25 are respectively connected to each other in each row unit, the operations described above are simultaneously carried out for the pixels in one row. The structure described above is also the same as that in the first embodiment.

Figure 10:
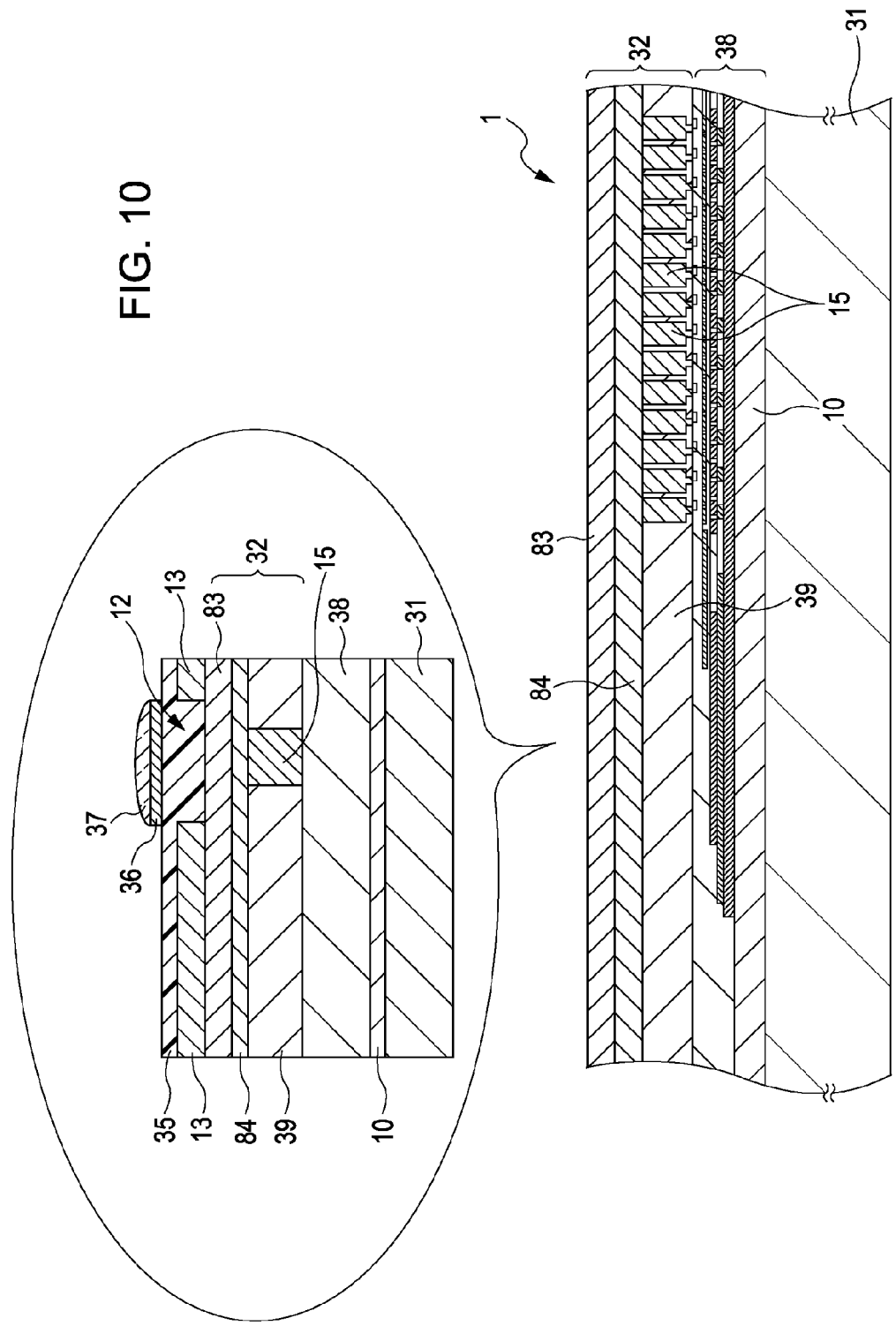
FIG. 10 is a schematic cross-sectional view illustrating a rear surface irradiation type solid-state image pick-up device which is another example of the solid-state image pick-up device according to an embodiment of the present invention.

FIG. 10 is a schematic cross-sectional view illustrating the rear surface irradiation type solid-state image pick-up device which is another example of the solid-state image pick-up device according to an embodiment of the present invention.

The solid-state image pick-up device 1 shown in FIG. 10 is primarily formed of the semiconductor support substrate 31, the semiconductor substrate main body 32, the passivation film 35, the color filter 36, and the microlens 37.

Incidentally, only in a partially enlarged view, the shading film 13, the passivation film 35, the color filter 36, and the microlens 37, which are provided over the semiconductor substrate main body 32, are shown.

The semiconductor substrate main body 32 is formed of n-type silicon. In addition, the semiconductor substrate main body 32 has the element forming layer 39 in which a plurality of the light receiving portions 15 and active elements (not shown), such as MOS transistors, which convert signal charges photoelectric-converted by the light receiving portions into electrical signals and output these electrical signals are formed, and the light receiving portions 15 and the active elements form the unit pixels. Furthermore, a $p^+$ layer 84 which is an impurity region is formed on the element forming layer 39 at a light incident side (rear surface side of the semiconductor substrate main body), and a gettering layer 83 is formed on the $p^+$ layer 84 at a light incident side (rear surface side of the semiconductor substrate main body).

In addition, the light receiving portion 15 corresponds to the photodiode 21 shown in FIG. 2 and is formed of a pn junction in the semiconductor substrate main body 32. In addition, the $p^+$ layer 84 is one example of a second conductive type impurity region.

In this embodiment, the semiconductor substrate main body 32 is formed by decreasing the thickness of a silicon wafer so as to make light incident from the rear surface.

Although the thickness of the semiconductor substrate main body 32 changes depending on the type of solid-state image pick-up device, the thickness thereof is 2 to 6 μm for visible light use and is 6 to 10 μm for infrared use.

In addition, the wiring layer 38 performing multilayer electrical wiring of the active elements, such as MOS transistors, is formed on the surface of the semiconductor substrate main body 32. In addition, the semiconductor support substrate 31 is adhered to the wiring layer 38 with the silicon dioxide layer 10 interposed therebetween.

The semiconductor support substrate 31 is provided to reinforce the strength of the semiconductor substrate main body 32 and is formed, for example, of a silicon substrate, and the thickness thereof is, for example, approximately 725 μm.

In addition, the shading film 13 which has the visible light incident apertures 12 in regions corresponding to the light receiving portions is formed on an upper layer of the semiconductor substrate main body 32, and the passivation film 35 is formed on an upper layer of the shading film 13. In addition, the color filter 36 and the microlens 37 are formed in a region corresponding to the visible light incident aperture 12.

Figure 11:
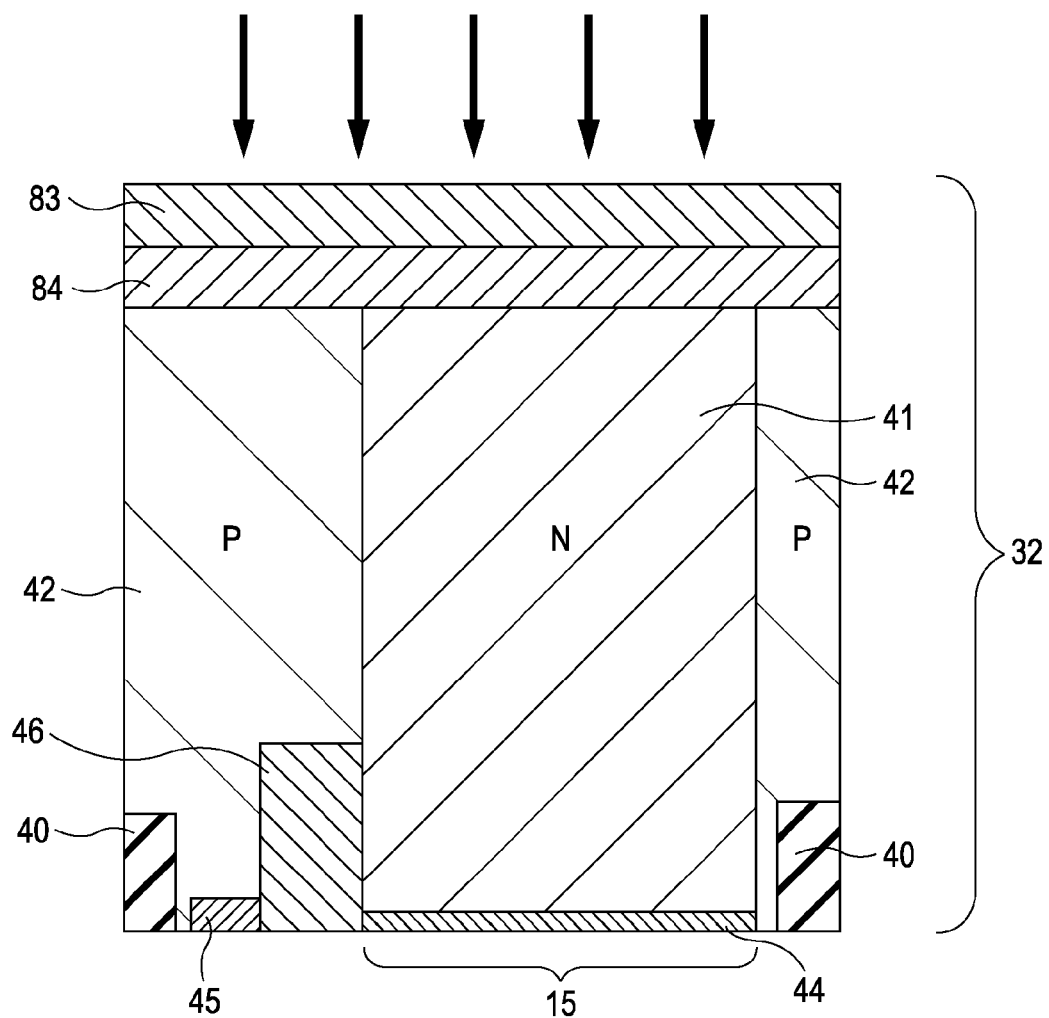
FIG. 11 is a cross-sectional view (2) of an important part of a pixel portion of a semiconductor substrate main body.

FIG. 11 is a cross-sectional view showing an important part of the pixel portion of the semiconductor substrate main body 32.

In the region of the light receiving portion 15, the n-type charge accumulation region 41 is formed in the semiconductor substrate main body 32. In order to place the region in which signal charges are stored closer to the surface side of the semiconductor substrate main body 32, the charge accumulation region 41 is preferably formed so that the impurity concentration is gradually increased toward the surface side of the semiconductor substrate main body 32. In addition, in order to efficiently receive incident light, the charge accumulation region 41 may be formed so that the area thereof is gradually increased toward the rear surface side of the semiconductor substrate main body 32.

In the semiconductor substrate main body 32, the p-type well 42 is formed around the charge accumulation region 41. In addition, in the region of the light receiving portion 15, the shallow p-type hole accumulation region 44 is formed in the semiconductor substrate main body 32 at the surface side.

In addition, the element isolation insulating film 40 made of silicon oxide is formed in the semiconductor substrate main body 32 at the surface side. Furthermore, the n-type floating diffusion (FD) 45 is formed in the semiconductor substrate main body 32 at the surface side.

The p-type region 46 is formed between the floating diffusion 45 and the charge accumulation region 41, and hence they are electrically isolated from each other.

In this fourth embodiment, the case in which the gettering layer 83 is formed on the entire surface of the $p^+$ layer 84 is described by way of example. However, it is sufficient when the gettering layer 83 can suppress metal contamination, which is caused by heavy metals, of a device (such as a photodiode) formed in the element forming layer 39. Accordingly, the gettering layer 83 may not be necessarily formed on the entire surface of the $p^+$ layer 84 and may be partially formed at the incident light side (the rear surface side of the semiconductor substrate main body) of the element forming layer 39. However, in consideration of the case in which the gettering layer 83 is used as an etching stopper in wet etching as describe later, the gettering layer 83 is preferably formed on the entire surface of the $p^+$ layer 84.

In addition, in the fourth embodiment, the case in which the gettering layer 83 is formed only at the light incident side (the rear surface side of the semiconductor substrate main body) of the element forming layer 39 is described by way of example. However, besides the gettering layer 83 formed at the light incident side of the element forming layer 39, the gettering portions (not shown) may also be formed in the element forming layer 39.

When the gettering portions are formed in the element forming layer 39, in order to prevent adverse influences caused by the flow of electrons generated due to crystalline defects of the gettering portions into the light receiving portion, the gettering portions are each necessarily formed to ensure a predetermined distance from the light receiving portion.

Furthermore, in the fourth embodiment, the case in which the $p^+$ layer 84 is formed on the entire surface of the element forming layer 39 is described by way of example. However, it is sufficient when the $p^+$ layer 84 is provided in the vicinity of the light receiving portion 15, and hence the $p^+$ layer 84 may not be necessarily formed on the entire surface of the element forming layer 39.

In addition, in the fourth embodiment, since the light receiving portion 15 (charge accumulation region 41) is an n-type region, the $p^+$ layer 84, which is a p-type impurity region, is formed. However, when the light receiving portion 15 (charge accumulation region 41) is a p-type region, an $n^+$ layer, which is an $n^+$-type impurity region, is to be formed.

[Operation of the Solid-State Image Pick-Up Device]

Hereinafter, the operation of the solid-state image pick-up device having the above structure will be described.

First, in a charge accumulation period, light incident from the rear surface side of the semiconductor substrate main body 32 is photoelectric-converted by the light receiving portion 15, and signal charges in an amount corresponding to the amount of the incident light is generated. The signal charges generated by the photoelectric conversion drift in the charge accumulation region 41 and are stored therein in the vicinity of the hole accumulation region 44.

In the charge accumulation period, a negative voltage is applied to the gate electrode of the transfer transistor 22, and the transfer transistor 22 is placed in an OFF state.

Next, when a reading operation is performed, a positive voltage is applied to the gate electrode of the transfer transistor 22, and the transfer transistor 22 is placed in an ON state. As a result, the signal charges stored in the light receiving portion 15 are transferred to the floating diffusion 45.

The positive voltage is, for example, a power source voltage (3.3 V or 2.7 V).

In this case, in accordance with the amount of the signal charges transferred to the floating diffusion 45, the potential thereof changes. In addition, the potential of the floating diffusion 45 is amplified by the amplifying transistor 23, and a voltage corresponding to the amplified potential is output to the vertical signal line 27.

Subsequently, when a reset operation is performed, a positive voltage is applied to the gate electrode of the reset transistor 25, and the potential of the floating diffusion 45 is reset to the voltage of the power source Vdd. In this step, by applying a negative voltage to the gate electrode of the transfer transistor 22, the transfer transistor 22 is placed in an OFF state.

The charge accumulation period, the reading operation, and the reset operation are repeatedly performed.

[Manufacturing Method (3) of the Solid-State Image Pick-Up Device]

Hereinafter, a manufacturing method of the solid-state image pick-up device having the above structure will be described. That is, another example of the manufacturing method of the solid-state image pick-up device according to an embodiment of the present invention will be described.

Figure 12A:
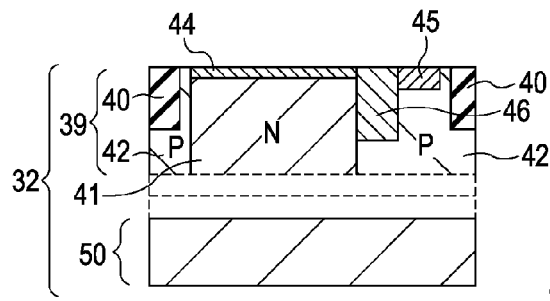
FIGS. 12A to 12D are schematic cross-sectional views illustrating another example of the manufacturing method of the solid-state image pick-up device according to an embodiment of the present invention.

In a manufacturing method (3) of the solid-state image pick-up device according to an embodiment of the present invention, as shown in FIG. 12A, the element isolation insulating film 40 is formed by a STI technique in the semiconductor substrate main body 32 which includes the element forming layer 39 and the thin film-forming removal layer 50. Next, by ion implantation methods, the n-type charge accumulation region 41, the p-type well 42, the p-type hole accumulation region 44, the floating diffusion 45, and the p-type region 46 are formed.

The formation order of the above regions is not particularly limited.

Figure 12B:
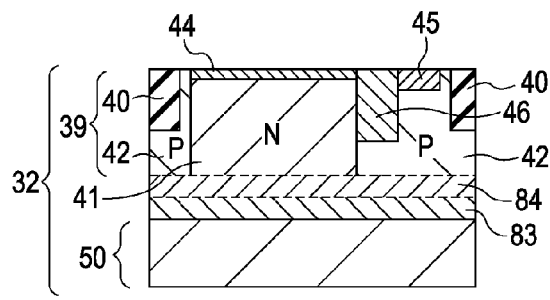

Subsequently, as shown in FIG. 12B, the p$^+$ layer 84 is formed in the element forming layer 39 at a side of the thin film-forming removal layer 50. In particular, for example, phosphorus (P) ions are implanted at a high energy, so that the p$^+$ layer 84 is formed. In addition, as shown in FIG. 12B, the gettering layer 83 is formed in the p$^+$ layer 84 at the thin film-forming removal layer 50 side. In particular, for example, after boron (B) ions or phosphorus (P) ions are implanted at a high energy, the implanted impurities are activated by a heat treatment using an arc lamp annealing device or the like, so that the gettering layer 83 is formed.

In this manufacturing method, although the case in which after the individual regions are formed in the element forming layer 39, the p$^+$ layer 84 and the gettering layer 83 are formed is described by way of example, the individual regions may be formed in the element forming layer 39 after the p$^+$ layer 84 and the gettering layer 83 are formed.

In addition, although the case in which after the p$^+$ layer 84 is formed, the gettering layer 83 is formed is described by way of example, the p$^+$ layer 84 may be formed after the gettering layer 83 is formed.

In addition, although the gettering layer 83 is formed in such a way that after boron (B) ions or phosphorus (P) ions are implanted at a high energy, the heat treatment is performed using an arc lamp annealing device or the like, the method for forming the gettering layer 83 is not limited to that described above. For example, the gettering layer 83 may be formed in such a way that after group IV ions, such as carbon ions or Si ions, are implanted, heat diffusion is performed at approximately 1,000 to 1,150° C.

Figure 12C:
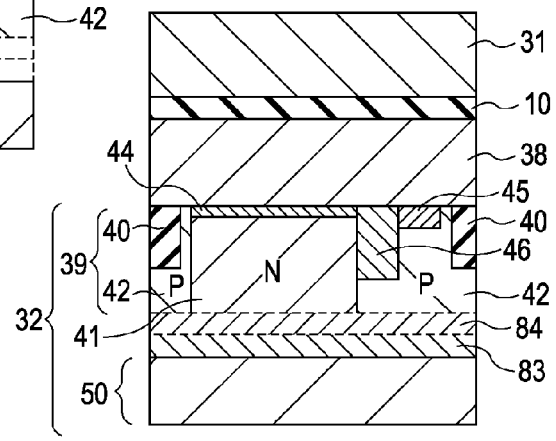

Next, insulation films and wires are repeatedly formed on the surface of the semiconductor substrate main body 32, so that the wiring layer 38 is formed. Subsequently, the semiconductor support substrate 31 made of silicon is adhered to the wiring layer 38 with the silicon dioxide layer 10 interposed therebetween (see FIG. 12C).

Figure 12D:
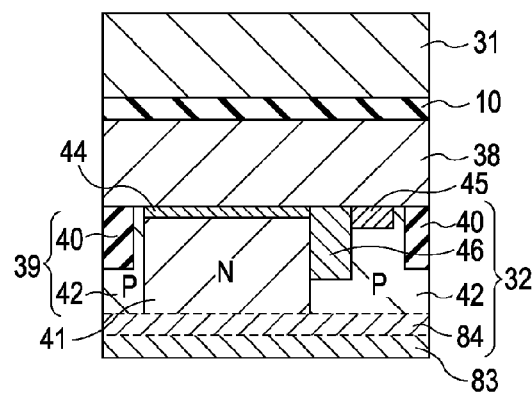

Subsequently, as shown in FIG. 12D, the thin film-forming removal layer 50 is removed by a wet etching method, so that the gettering layer 83 is exposed. Since an impurity region which is heavily doped with impurities, such as boron (B) ions or phosphorus (P) ions, is able to function as an etching stopper, the gettering layer 83 functions as an etching stopper in the wet etching.

Next, the shading film 13 is formed on the semiconductor substrate main body 32, and a pattern processing is performed on the shading film 13 to form the visible light incident apertures 12 corresponding to the light receiving portions. Furthermore, the passivation film 35 is formed on the shading film 13 by a CVD method, and the color filters 36 and the microlenses 37 are also formed, so that the solid-state image pick-up device shown in FIG. 10 can be obtained.

Solid-state image pick-up devices comprising the semiconductor substrate main body 32 of a wafer level are separated into chips by dicing the wafer, and the chips thus separated are each processed by mounting, bonding, and sealing, so that the individual solid-state image pick-up devices can be formed.

[Manufacturing Method (4) of the Solid-State Image Pick-Up Device]

Hereinafter, another method for manufacturing the solid-state image pick-up device having the above structure will be described. That is, another example of the method for manufacturing the solid-state image pick-up device according to an embodiment of the present invention will be described.

Figure 12E:
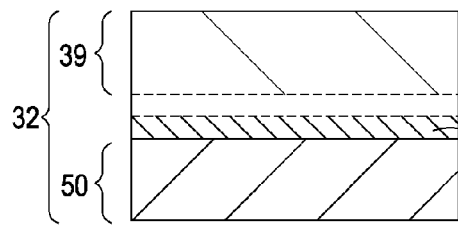
FIGS. 12E to 12H are schematic cross-sectional views illustrating another example of the manufacturing method of the solid-state image pick-up device according to an embodiment of the present invention.

In a method (4) for manufacturing the solid-state image pick-up device according to an embodiment of the present invention, as shown in FIG. 12E, when the semiconductor substrate main body 32 is formed, the gettering layer 83 is formed between the element forming layer 39 and the thin film-forming removal layer 50 of the semiconductor substrate main body 32. In particular, for example, after boron (B) ions or phosphorus (P) ions are implanted at a high energy, the implanted impurities are activated by a heat treatment using an arc lamp annealing device or the like, so that the gettering layer 83 is formed.

That is, in the method (3) for manufacturing the solid-state image pick-up device according to an embodiment of the present invention, the gettering layer 83 is formed in a wafer process. On the other hand, in the method (4) for manufacturing the solid-state image pick-up device according to an embodiment of the present invention, the gettering layer 83 is formed in a substrate manufacturing process which is performed before a wafer process.

This method for forming the gettering layer 83 will be described with reference to a particular example.

In general, the semiconductor substrate main body 32 used for a solid-state image pick-up device is provided with an epitaxial film (not shown) thereon. In other words, the semiconductor substrate main body 32 provided with an epitaxial film grown thereon is variously processed in a wafer process. In the manufacturing method (3) of the solid-state image pick-up device according to an embodiment of the present invention, since the gettering layer 83 is formed in a wafer process, after an epitaxial film is formed on the semiconductor substrate main body 32, the gettering layer 83 is formed. On the other hand, in the manufacturing method (4) of the solid-state image pick-up device according to an embodiment of the present invention, since the gettering layer 83 is formed in a substrate manufacturing process, the gettering layer 83 is formed in the semiconductor substrate main body 32, and an epitaxial film is then formed on the semiconductor substrate main body 32.

Figure 12G:
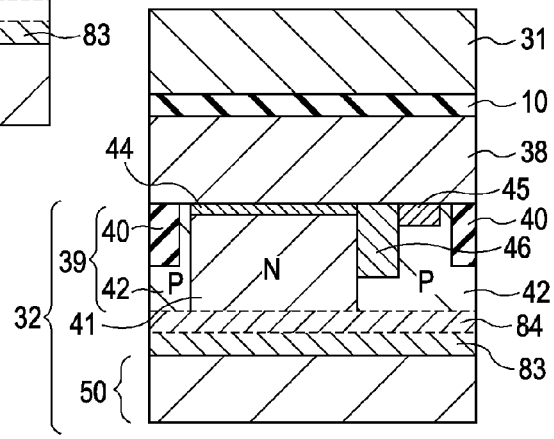
Figure 12F:
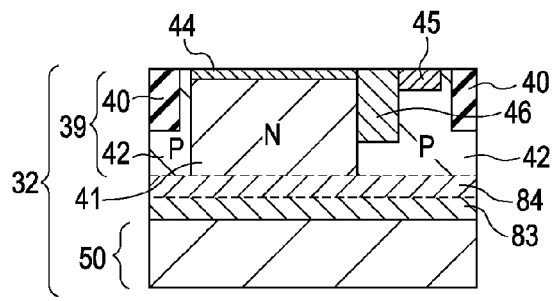

Subsequently, as shown in FIG. 12F, the element isolation insulating film 40 is formed by a STI technique in the element forming layer 39 of the semiconductor substrate main body 32. In addition, by ion implantation methods, the n-type charge accumulation region 41, the p-type well 42, and the p-type hole accumulation region 44, the floating diffusion 45, and the p-type region 46 are formed.

The formation order of the above regions is not particularly limited.

Furthermore, as shown in FIG. 12F, the p$^+$ layer 84 is formed between the element forming layer 39 and the gettering layer 83. In particular, the p$^+$ layer 84 is formed, for example, by implanting phosphorus (P) ions at a high energy.

Although the case in which the individual regions are formed in the element forming layer 39, and the p$^+$ layer 84 is then formed is described by way of example, after the p$^+$ layer 84 is formed, the individual regions may be formed in the element forming layer 39.

Next, insulation films and wires are repeatedly formed on the surface of the semiconductor substrate main body 32, so that the wiring layer 38 is formed. Subsequently, the semiconductor support substrate 31 made of silicon is adhered to the wiring layer 38 with the silicon dioxide layer 10 interposed therebetween (see FIG. 12G).

Figure 12H:
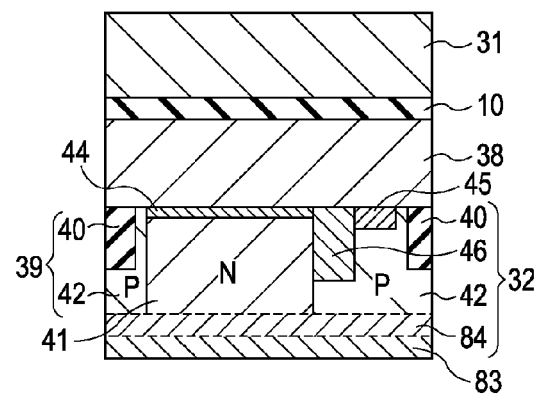

Subsequently, as shown in FIG. 12H, the thin film-forming removal layer 50 is removed by a wet etching method, so that the gettering layer 83 is exposed. Since an impurity region which is heavily doped with impurities, such as boron (B) ions or phosphorus (P) ions, is able to function as an etching stopper, the gettering layer 83 functions as an etching stopper in the wet etching.

Next, the shading film 13 is formed on the semiconductor substrate main body 32, and a pattern processing is performed on the shading film 13 to form the visible light incident apertures 12 corresponding to the light receiving portions. Furthermore, the passivation film 35 is formed on the shading film 13 by a CVD method, and the color filters 36 and the microlenses 37 are also formed, so that the solid-state image pick-up device shown in FIG. 10 can be obtained.

Solid-state image pick-up devices comprising the semiconductor substrate main body 32 of a wafer level are separated into chips by dicing the wafer, and the chips thus separated are each processed by mounting, bonding, and sealing, so that the individual solid-state image pick-up devices can be formed.

In the fourth embodiment, the case in which the gettering layer 83 is used as an etching stopper, and the thin film-forming removal layer 50 is removed by etching using a wet etching method is described by way of example. However, a wet etching method may not be necessarily used as the method for removing the thin film-forming removal layer 50, and for example, the thin film-forming removal layer 50 may be removed by a mechanical polishing using a CMP method. The method for removing the thin film-forming removal layer 50 described above may be applied to both the manufacturing methods (3) and (4) of the solid-state image pick-up device according to an embodiment of the present invention.

In addition, in the fourth embodiment, the p$^+$ layer 84 and the gettering layer 83 are formed between the element forming layer 39 and the thin film-forming removal layer 50, and the thin film-forming removal layer 50 is then removed, so that the gettering layer 83 is exposed. However, it is sufficient when the p$^+$ layer 84 and the gettering layer 83 can be formed on the upper layer (incident light side) of the element forming layer 39. Hence, by using the semiconductor substrate main body 32 having no thin film-forming removal layer 50, the p$^+$ layer 84 and the gettering layer 83 may be formed on the upper layer (incident light side) of the element forming layer 39. However, since the semiconductor substrate main body 32 having no thin film-forming removal layer 50 has a thickness of approximately 10 μl, it is believed that the handling of the semiconductor substrate main body 32 becomes considerably difficult in a manufacturing process. Hence, in consideration of the convenience of handling the semiconductor substrate main body 32 in a manufacturing process, it is believed that by using the semiconductor substrate main body 32 including the thin film-forming removal layer 50, the thin film-forming removal layer 50 is preferably removed after the semiconductor support substrate 31 is adhered to the wiring layer 38. The use of the thin film-forming removal layer described above may be applied to both the manufacturing methods (3) and (4) of the solid-state image pick-up device according to an embodiment of the present invention.

In the another example of the solid-state image pick-up device according to an embodiment of the present invention, since the gettering layer 83 is formed, after the thin film-forming removal layer 50 is removed, metal contamination caused by heavy metals can be prevented in various processes.

In addition, since the p$^+$ layer 84 is formed, electrons generated due to crystalline defects of the gettering layer 83 are suppressed from flowing into the light receiving portion. In particular, even if electrons are generated due to crystalline defects of the gettering layer 83, the electrons thus generated can be combined with holes in the p$^+$ layer 84, and as a result, the electrons are suppressed from flowing into the light receiving portion. Accordingly, noises of the solid-state image pick-up device are reduced, and the S/N ratio of the device can be improved.

5. Fifth Embodiment

Structure of a Semiconductor Device

Figure 13:
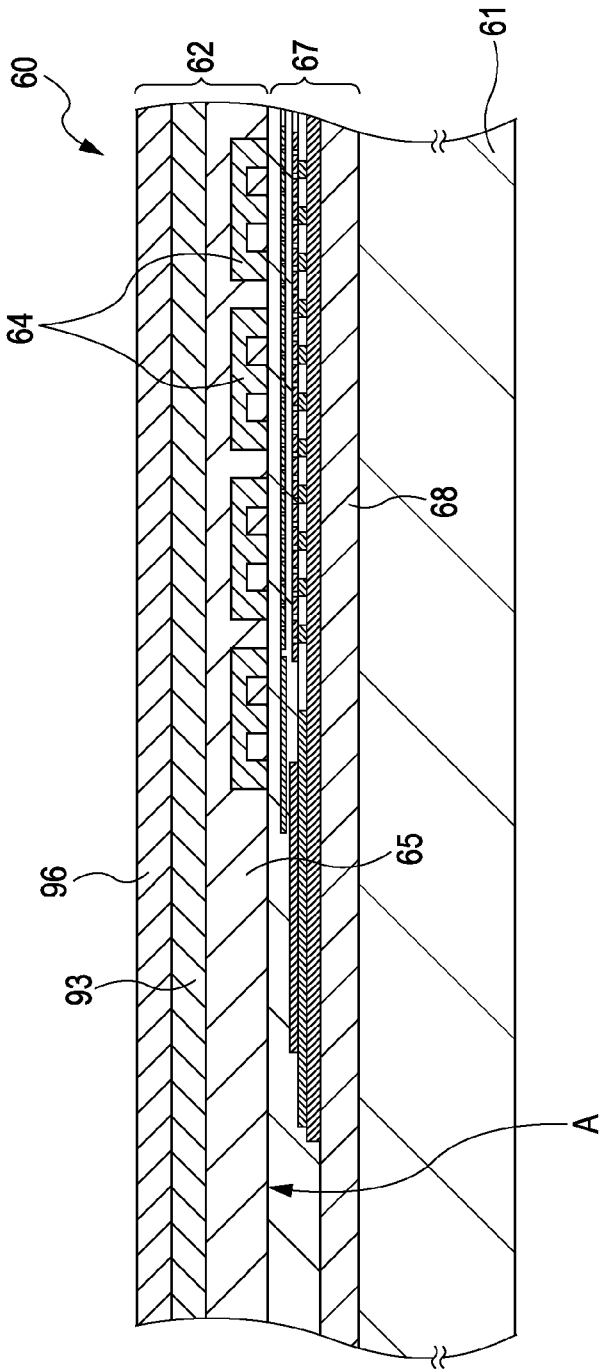
FIG. 13 is a schematic cross-sectional view illustrating another example of the semiconductor device according to an embodiment of the present invention.

FIG. 13 is a schematic cross-sectional view illustrating another example of the semiconductor device according to an embodiment of the present invention. The semiconductor device 60 shown in this embodiment is, for example, RAM, ROM, or LSI and is primarily formed of the semiconductor support substrate 61 and the semiconductor substrate main body 62.

The semiconductor substrate main body 62 is formed of n-type silicon. In addition, the semiconductor substrate main body 62 has the element forming layer 65 in which the n-type devices 64, such as a logic element, an active element, and a passive element, are formed. Furthermore, a p$^+$ layer 93, which is an impurity region, is formed on the element forming layer 65, and a gettering layer 96 is formed on the p$^+$ layer 93.

Although the thickness of the semiconductor substrate main body 62 changes depending on the type of semiconductor device, the thickness necessary for forming a device is approximately 10 μm. In addition, the p$^+$ layer 93 is one example of a second conductive type impurity region.

In addition, the wiring layer 67 performing multilayer electrical wiring of the devices 64 is formed on one surface (surface indicated by the mark A) of the semiconductor substrate main body 62. In addition, the semiconductor support substrate 61 is adhered to the wiring layer 67 with the silicon dioxide layer 68 interposed therebetween.

The semiconductor support substrate 61 is provided to reinforce the strength of the semiconductor substrate main body 62 and is formed, for example, of a silicon substrate, and the thickness thereof is, for example, approximately 725 μm.

As in the fourth embodiment, the gettering layer 96 may not be necessarily formed on the entire surface of the p$^+$ layer 93 and may be partially formed thereon. However, in consideration of the case in which the gettering layer 96 is used as an etching stopper in wet etching as describe later, the gettering layer 96 is preferably formed on the entire surface of the p$^+$ layer 93.

In addition, as in the fourth embodiment described above, the gettering portions may also be formed in the element forming layer 65 besides the gettering layer 96 formed above the element forming layer 65. However, by the formation of the gettering portion in the element forming layer 65, when electrons generated due to crystalline defects of the gettering portion may adversely influence the devices in some cases, the gettering portions are each necessarily formed to ensure a predetermined distance from the devices.

In the fifth embodiment, since the device 64 is an n type, the p$^+$ layer 93, which is a p$^+$-type impurity region, is formed. However, when the device 64 is a p type, an n$^+$ layer, which is an n$^+$-type impurity region, is to be formed.

[Manufacturing Method (3) of the Semiconductor Device]

Hereinafter, another method for manufacturing the semiconductor device having the above structure will be described. That is, another example of the method for manufacturing the semiconductor device according to an embodiment of the present invention will be described.

Figure 14A:
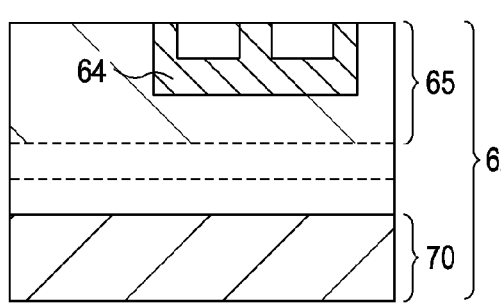
FIGS. 14A to 14D are schematic cross-sectional views illustrating another example of the manufacturing method of the semiconductor device according to an embodiment of the present invention.

In a method (3) for manufacturing the semiconductor device according to an embodiment of the present invention, as shown in FIG. 14A, the device 64 is formed in the semiconductor substrate main body 62 which includes the element forming layer 65 and the thin film-forming removal layer 70.

Figure 14C:
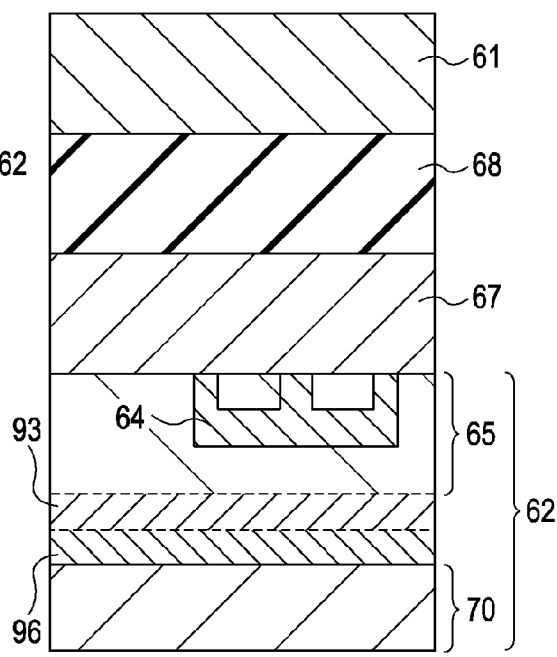
Figure 14B:
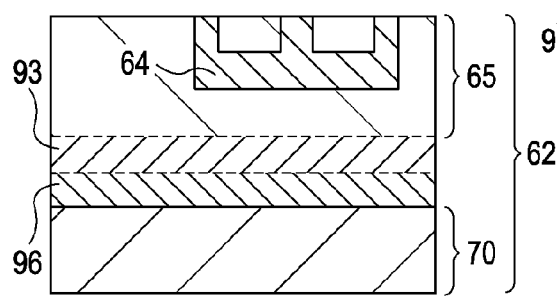

Subsequently, as shown in FIG. 14B, the p$^+$ layer 93 is formed in the element forming layer 65 at a side of the thin film-forming removal layer 70. In particular, for example, phosphorous (P) ions are implanted at a high energy, so that the p$^+$ layer 93 is formed. In addition, as shown in FIG. 14B, the gettering layer 96 is formed in the p$^+$ layer 93 at the thin film-forming removal layer 70 side. In particular, for example, after boron (B) ions or phosphorus (P) ions are implanted at a high energy, the implanted impurities are activated by a heat treatment using an arc lamp annealing device or the like, so that the gettering layer 96 is formed.

In this embodiment, although the case in which after the device 64 is formed in the element forming layer 65, the p$^+$ layer 93 and the gettering layer 96 are formed is described by way of example, the device 64 may be formed in the element forming layer 65 after the p$^+$ layer 93 and the gettering layer 96 are formed.

In addition, although the case in which after the p$^+$ layer 93 is formed, the gettering layer 96 is formed is described by way of example, after the gettering layer 96 is formed, the p$^+$ layer 93 may be formed.

In addition, although the gettering layer 96 is formed in such a way that after boron (B) ions or phosphorus (P) ions are implanted at a high energy, the heat treatment is performed using an arc lamp annealing device or the like, the method for forming the gettering layer 96 is not limited to that described above. For example, the gettering layer 96 may be formed in such a way that after group IV ions, such as carbon ions or Si ions, are implanted, heat diffusion is performed at approximately 1,000 to 1,150° C.

Next, insulation films and wires are repeatedly formed on one surface of the semiconductor substrate main body 62, so that the wiring layer 67 is formed. Subsequently, the semiconductor support substrate 61 made of silicon is adhered to the wiring layer 67 with the silicon dioxide layer 68 interposed therebetween (see FIG. 14C).

Figure 14D:
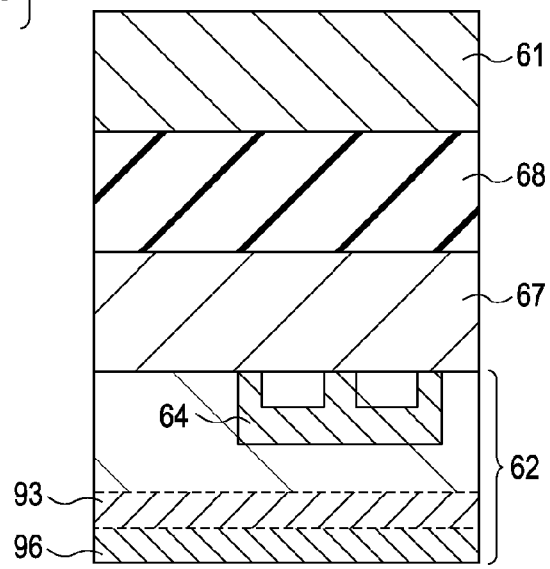

Subsequently, as shown in FIG. 14D, the thin film-forming removal layer 70 is removed by a wet etching method to expose the gettering layer 96, so that the semiconductor device shown in FIG. 13 can be obtained. In this wet etching, the gettering layer 96 functions as an etching stopper.

Semiconductor devices comprising the semiconductor substrate main body 62 of a wafer level are separated into chips by dicing the wafer, and the chips thus separated are each processed by mounting, bonding, and sealing, so that the individual semiconductor devices can be formed.

[Manufacturing Method (4) of the Semiconductor Device]

Hereinafter, another method for manufacturing the semiconductor device having the above structure will be described. That is, another example of the method for manufacturing the semiconductor device according to an embodiment of the present invention will be described.

Figure 14E:
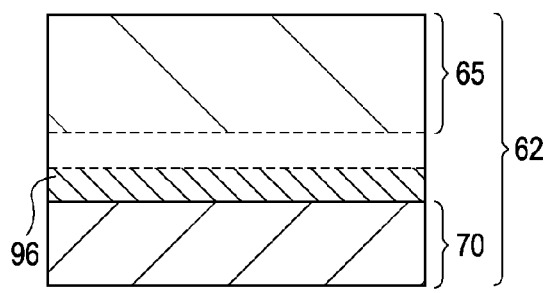
FIGS. 14E to 14H are schematic cross-sectional views illustrating another example of the manufacturing method of the semiconductor device according to an embodiment of the present invention.

In a method (4) for manufacturing the semiconductor device according to an embodiment of the present invention, as shown in FIG. 14E, when the semiconductor substrate main body 62 is formed, the gettering layer 96 is formed between the element forming layer 65 and the thin film-forming removal layer 70 of the semiconductor substrate main body 62. In particular, for example, after boron (B) ions or phosphorus (P) ions are implanted at a high energy, the implanted impurities are activated by a heat treatment using an arc lamp annealing device or the like, so that the gettering layer 96 is formed.

That is, in the method (3) for manufacturing the semiconductor device according to an embodiment of the present invention, the gettering layer 96 is formed in a wafer process. On the other hand, in the method (4) for manufacturing the semiconductor device according to an embodiment of the present invention, the gettering layer 96 is formed in a substrate manufacturing process which is performed before a wafer process.

This method for forming the gettering layer 96 will be described with reference to a particular example.

In general, the semiconductor substrate main body 62 used for a semiconductor device is provided with an epitaxial film (not shown) thereon. In other words, the semiconductor substrate main body 62 provided with an epitaxial film grown thereon is variously processed in a wafer process. In the manufacturing method (3) of the semiconductor device according to an embodiment of the present invention, since the gettering layer 96 is formed in a wafer process, after an epitaxial film is formed on the semiconductor substrate main body 62, the gettering layer 96 is formed. On the other hand, in the manufacturing method (4) of the semiconductor device according to an embodiment of the present invention, since the gettering layer 96 is formed in a substrate manufacturing process, the gettering layer 96 is formed in the semiconductor substrate main body 62, and an epitaxial film is then formed thereon.

Figure 14G:
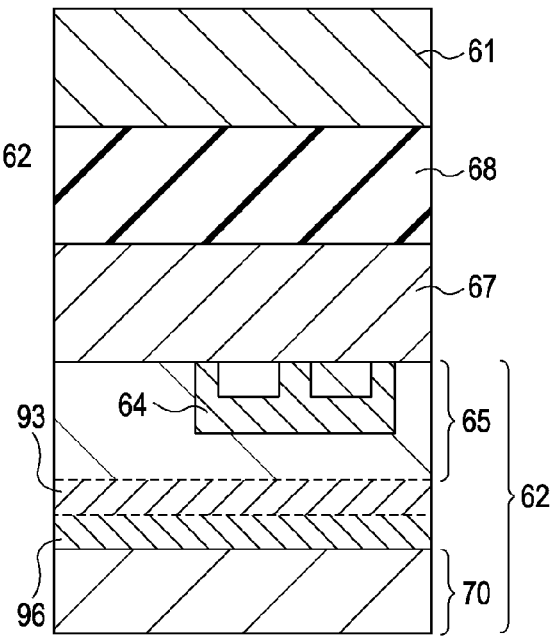
Figure 14F:
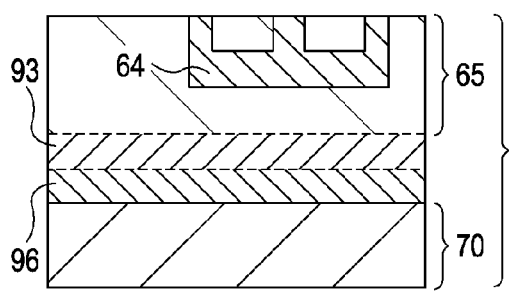

Next, as shown in FIG. 14F, the device 64 is formed in the element forming layer 65 of the semiconductor substrate main body 62.

Subsequently, insulation films and wires are repeatedly formed on one surface of the semiconductor substrate main body 62, so that the wiring layer 67 is formed. Next, the semiconductor support substrate 61 made of silicon is adhered to the wiring layer 67 with the silicon dioxide layer 68 interposed therebetween (see FIG. 14G).

Figure 14H:
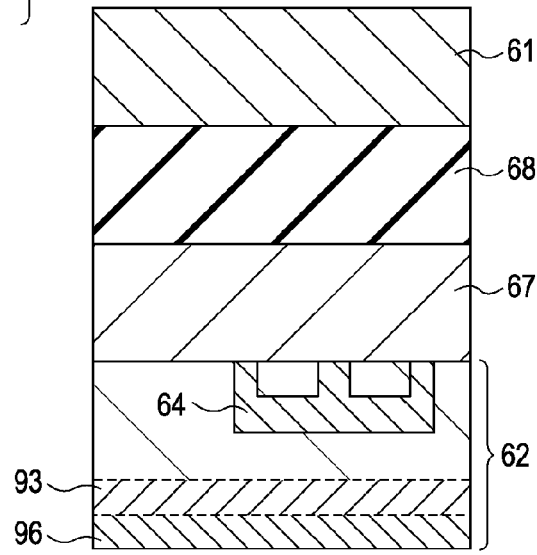
Figure 15:
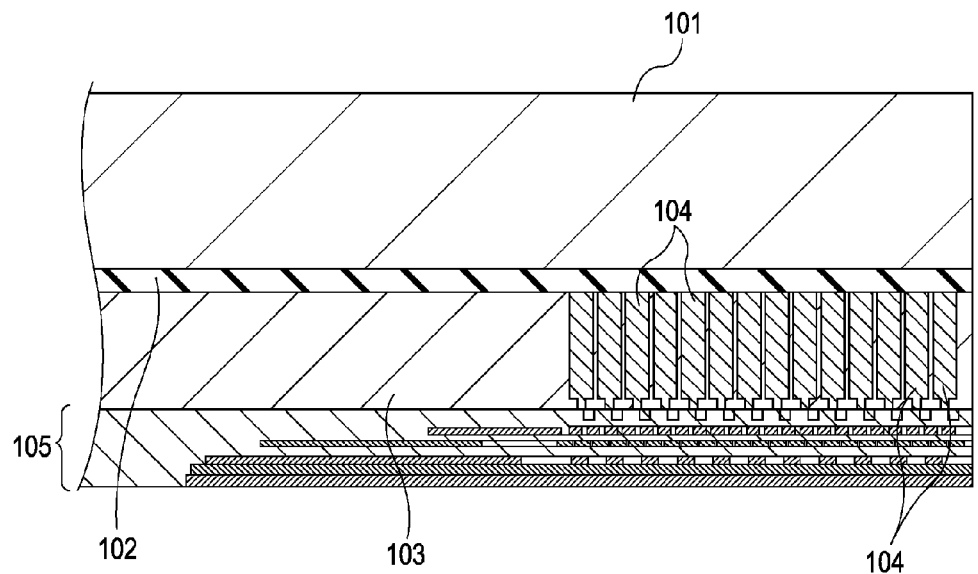
FIG. 15 is a schematic cross-sectional view (1) illustrating a related example in which a rear surface irradiation type solid-state image pick-up device is formed using a semiconductor substrate having an SOI structure.
Figure 16:
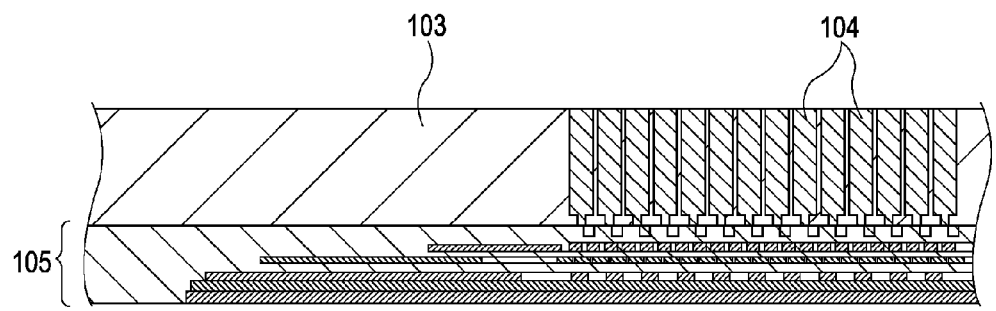
FIG. 16 is a schematic cross-sectional view (2) illustrating a related example in which a rear surface irradiation type solid-state image pick-up device is formed using a semiconductor substrate having an SOI structure.

Subsequently, as shown in FIG. 14H, the thin film-forming removal layer 70 is removed by a wet etching method to expose the gettering layer 96, so that the semiconductor device shown in FIG. 13 can be obtained.

Semiconductor devices comprising the semiconductor substrate main body 62 of a wafer level are separated into chips by dicing the wafer, and the chips thus separated are each processed by mounting, bonding, and sealing, so that the individual semiconductor devices can be formed.

In this embodiment, as the method for removing the thin film-forming removal layer 70, a wet etching method may not be necessarily used, and for example, the thin film-forming removal layer 70 may be removed by mechanical polishing using a CMP method. As in the fourth embodiment described above, the above method for removing the thin film-forming removal layer 70 may be applied to both the manufacturing methods (3) and (4) of the semiconductor device according to an embodiment of the present invention.

In the example of the semiconductor device according to an embodiment of the present invention, since the gettering layer 96 is formed, after the thin film-forming removal layer 70 is removed, metal contamination caused by heavy metals can be prevented in various processes.

In addition, since the p$^+$ layer 93 is formed, electrons generated due to crystalline defects of the gettering layer 96 are suppressed from flowing into the device. In particular, even if electrons are generated due to crystalline defects of the gettering layer 96, the electrons can be combined with holes of the p$^+$ layer 93, and as a result, electrons are suppressed from flowing into the device. Accordingly, noises of the semiconductor device are reduced.

The present application contains subject matter related to that disclosed in Japanese Priority Patent Application JP 2009-026368 filed in the Japan Patent Office on Feb. 6, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state image pick-up device comprising:
    a semiconductor substrate main body which includes an element forming layer and a gettering layer provided on an upper layer thereof;
    photoelectric conversion elements, each of which includes a first conductive type region, provided in the element forming layer; and
    a dielectric film which is provided on an upper layer of the gettering layer and which induces a second conductive type region in a surface of the gettering layer, wherein the dielectric film has a negative fixed charge.

2. The solid-state image pick-up device according to claim 1, wherein the dielectric film is an insulating film which is at least partially crystallized.

3. The solid-state image pick-up device according to claim 2, wherein the dielectric film is an oxide insulating film which includes an element selected from the group consisting of hafnium, zirconium, aluminum, tantalum, titanium, yttrium, and lanthanide and which is at least partially crystallized.

4. The solid-state image pick-up device according to claim 1, wherein the dielectric film functions as an antireflection film.

5. The solid-state image pick-up device according to claim 1, further comprising:
    active elements which convert signal charges photoelectric-converted by the photoelectric conversion elements into electrical signals and which output the electrical signals; and
    a wiring layer which is provided by lamination on the surface of the element forming layer opposite to the gettering layer and which performs wiring of the active elements.

6. The solid-state image pick-up device according to claim 5, further comprising:
    a support substrate layer provided on the surface of the wiring layer opposite to the element forming layer.

7. The solid-state image pick-up device according to one of claim 1, and claims 2 to 6, further comprising:
    microlenses which are provided on the upper layer of the dielectric film and which condense light incident on the photoelectric conversion elements.

8. An image pick-up apparatus comprising:
    a solid-state image pick-up device including a semiconductor substrate main body which has an element forming layer and a gettering layer provided on an upper layer thereof;
    photoelectric conversion elements, each of which includes a first conductive type region, formed in the element forming layer;
    a dielectric film which is provided on an upper layer of the gettering layer and which induces a second conductive type region in a surface of the gettering layer, wherein the dielectric film has a negative fixed charge;
    an optical system for guiding incident light from an object to the solid-state image pick-up device; and
    a signal processing circuit for processing an output signal from the solid-state image pick-up device.

9. A semiconductor device comprising:
    a semiconductor substrate main body which includes an element forming layer and a gettering layer provided on an upper layer of the element forming layer;
    a device which includes a first conductive type region and is formed in the element forming layer; and
    a dielectric film which is provided on an upper layer of the gettering layer and which induces a second conductive type region in a surface of the gettering layer, wherein the dielectric film has a negative fixed charge.

10. A semiconductor substrate comprising:
    a semiconductor substrate main body which includes an element forming layer in which a device including a first conductive type region is provided and a gettering layer provided on an upper layer of the element forming layer; and
    a dielectric film which is provided on an upper layer of the gettering layer and which induced a second conductive type region in a surface of the gettering layer, wherein the dielectric film has a negative fixed charge.

* * * * *